United States Patent
Nemoto

(10) Patent No.: US 7,943,203 B2
(45) Date of Patent: May 17, 2011

(54) COLORED CURABLE COMPOSITION, COLORED PATTERN AND COLOR FILTER USING THE SAME

(75) Inventor: Yoichi Nemoto, Shizuoka-ken (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 156 days.

(21) Appl. No.: 12/199,074

(22) Filed: Aug. 27, 2008

(65) Prior Publication Data

US 2009/0085017 A1 Apr. 2, 2009

(30) Foreign Application Priority Data

Sep. 27, 2007 (JP) ................................. 2007-251497

(51) Int. Cl.
*G02B 5/20* (2006.01)
*G03F 7/004* (2006.01)

(52) U.S. Cl. ................ 427/510; 430/7; 430/20; 522/79; 522/75; 522/83; 522/121; 522/127

(58) Field of Classification Search .................... 522/83, 522/75, 79, 121, 127; 430/7, 20; 427/510
See application file for complete search history.

(56) References Cited

U.S. PATENT DOCUMENTS

| | | | | |
|---|---|---|---|---|
| 6,100,312 A * | 8/2000 | Suzuki et al. | | 522/6 |
| 6,455,208 B1 * | 9/2002 | Yamashiki et al. | | 430/7 |
| 6,716,897 B2 * | 4/2004 | Okutsu et al. | | 524/88 |
| 6,726,762 B2 * | 4/2004 | Okamoto et al. | | 106/493 |
| 6,949,678 B2 * | 9/2005 | Kunimoto et al. | | 564/255 |
| 7,121,661 B2 * | 10/2006 | Watanabe | | 347/102 |
| 7,156,912 B2 * | 1/2007 | Sato et al. | | 106/413 |
| 7,285,371 B2 * | 10/2007 | Huang et al. | | 430/270.1 |
| 7,662,878 B2 * | 2/2010 | Idemura et al. | | 524/357 |
| 2006/0194029 A1 * | 8/2006 | Tsujihata | | 428/195.1 |
| 2008/0287554 A1 * | 11/2008 | Gittins et al. | | 516/9 |

FOREIGN PATENT DOCUMENTS

| | | |
|---|---|---|
| JP | 3130217 B2 | 1/2001 |
| JP | 2003-026950 A | 1/2003 |
| JP | 2004-233727 A | 8/2004 |

\* cited by examiner

*Primary Examiner* — Susan W Berman
(74) *Attorney, Agent, or Firm* — Buchanan Ingersoll & Rooney PC

(57) ABSTRACT

A colored curable composition containing a pigment (A) made into fine particles in the presence of sodium chloride (NaCl), an alkali soluble resin (B), a polymerizable compound (C), a photopolymerization initiator (D), and a solvent (E), wherein the pigment is included at 40 mass % to 70 mass % with respect to the total solids of the colored curable composition, and the contact angle of water to a coated layer obtained from coating the colored curable composition on a substrate and drying is 60° or greater. The colored curable composition is excellent in pigment dispersibility and dispersion stability, even when a fine pigment is included therein, is capable of forming a highly uniform colored layer, with excellent cleanability and solubility of the dried colored layer. The composition can also suppress the generation of foreign matter and the like in slit coating.

7 Claims, No Drawings

COLORED CURABLE COMPOSITION, COLORED PATTERN AND COLOR FILTER USING THE SAME

CROSS-REFERENCE TO RELATED APPLICATION

This application claims priority under 35USC119 from Japanese Patent Application No. 2007-251497, the disclosures of which are incorporated by reference herein.

BACKGROUND OF THE INVENTION

1. Field of the Invention

The present invention relates to a colored curable composition, a colored pattern formed using such a colored curable composition, and a color filter provided with the colored pattern.

2. Description of the Related Art

A color filter is manufactured by forming, using a photolithographic method, an ink-jet method, or the like, a colored pattern and a black matrix made with colored curable compositions that include a pigment dispersion composition, in which an organic pigment or an inorganic pigment is dispersed, a polymerizable compound, a polymerization initiator, an alkali soluble resin, and other components.

Recently, color filters are not only being used in liquid crystal display (LCD) elements for monitor applications, but applications thereof are also expanding to televisions (TVs). Accompanying such expansion in applications has been a desire for improvements in productivity, in order to be able to efficiently manufacture color filters having a large surface area. For this reason, slit coating methods have become the main coating method used for forming the colored patterns of color resists, in place of general-purpose spin coating. If dry matter of a curable composition adheres and accumulates on a slit coating head, when carrying out slit coating of a curable composition to a substrate surface during the mass production of panels of large surface area, then foreign matter defects would occur in the panels obtained therefrom. In order to prevent such occurrences, a coating head has been placed in a solvent atmosphere when on standby, or a nozzle cleaning mechanism has been provided and periodic washing has been carried out, as means to suppress the generation of foreign matter. However, these require a complicated process on the coating device side.

Further, in order to form a colored region with a curable composition, drying has been suppressed between formations of coated layers having specific surface areas, and good cleanability of uncured regions in dried coated layers has been desired. In order to improve the cleanability of the dry coated layers, it is necessary for a dry layer formed from a photo curable composition to be readily dissolved by the nozzle cleaning solvent and by the liquid of the curable composition supplied for coating.

The uniformity of dispersion of pigment as colorant in the curable composition also contributes greatly to the uniformity of the coated layer itself. Thus, a finer state of dispersion (good dispersibility) and more stable dispersion (good dispersion stability) has been desired for a pigment that is included in a colored curable composition. When the dispersibility of a pigment is insufficient, this may lead to a large amount of development residue (residue) on a substrate, to a reduction in chromaticity and dimensional precision of a manufactured color filter, or to a significant deterioration in the contrast thereof. When the dispersion stability of a pigment is insufficient, then, in particular, during the manufacturing processes of the color filter, the uniformity of layer thickness in the colored curable composition coating process may readily fall, the sensitivity in the exposure process may readily fall, and/or the alkali solubility in the development process may readily fall. When there is poor dispersion stability of the pigment, this may cause an aggregation of the composition components of the colored curable composition and cause a rise in viscosity with time, leading to an extremely short pot-life thereof.

Although it is effective to make the particle size of a pigment finer in order to improve coloring characteristics, such as the contrast of a color filter, since the surface area of the pigment particles becomes larger when the particle size of a pigment is made finer, the cohesive force between pigment particles becomes strong, and it has been difficult to achieve both a high level of dispersibility and a high level of dispersion stability.

The following techniques are known for making pigment particles finer and improving the dispersibility of pigment particles.

Generally, a method (salt milling method) is known for making the primary particles of a pigment finer by mechanically mixing and kneading, using a kneader or the like, a pigment, a water soluble inorganic salt, and a water soluble organic solvent which does not dissolve substantially such an inorganic salt. The primary particle mixture of the obtained fine pigment is added to water and agitated, using a mixer or the like, to form a slurry state. Next, by filtering this slurry, washing with water and drying, a fine pigment is obtained as a secondary aggregate, which is an aggregate of the primary particles of the pigment. The dispersion process in ordinary dispersion machines, such as a sand mill, a ball mill, or the like, is a process that loosens the secondary aggregate, which is an aggregate of the primary particles of pigment, obtaining a dispersion body that is close to the state of the primary particles.

However, as the primary particles of the pigment are made finer, aggregation readily occurs and an aggregate (secondary aggregate) is readily generated either in the slurry state or during drying. Strong secondary aggregation more readily occurs as the primary particles of a pigment become finer. Therefore, it has been generally very difficult to re-disperse back to primary particles a pigment that has been made fine. A color filter formed using a dispersion body in which a large amount of secondary aggregates exists not only has a large amount of light dispersion, and a significant reduction in contrast and has occurrences of color density unevenness, but also the cleanability and solubility of the un-cured layer thereof deteriorate due to aggregations of pigment. Therefore, it is desirable for a pigment dispersion composition to have primary particles that are dispersed stably without aggregating, as well as desirable for the pigment dispersion composition to have good handling characteristics.

With the objective of suppressing the strong secondary aggregation of such fine pigments, techniques are proposed for obtaining a high color contrast color filter using such a pigment dispersion by processing the pigment by adding a rosin or rosin derivative, or a nonaqueous-soluble monomer or oligomer, during salt mill processing (see, for example, Japanese Patent No. 3130217 and Japanese Patent Application Laid-Open (JP-A) No. 2004-233727). A technique is also proposed for obtaining a pigment dispersion composition excellent in dispersion stability by using a polymer compound having a heterocycle in a side chain thereof as a pigment dispersant in the dispersion process, and obtaining a colored photosensitive composition and high color contrast color filter using the same (see, for example, JP-A No. 2003-

26950). However, from a practical point of view further improvements are desired in the dispersibility and dispersion stability of fine pigments.

Thus, in order to improve productivity in the mass production of LCD panels for large-sized TVs, improvements in the coatability of photosensitive compositions of dispersed pulverized pigments and fine pigment particles, and in addition improvements in cleanability of color resist dry layers formed with such photosensitive compositions, are important.

SUMMARY OF THE INVENTION

The present invention has been made in view of the above circumstances and provides colored curable composition, colored pattern and color filter using the same. A first aspect of the present invention provides a colored curable composition comprising a pigment (A) made into fine particles in the presence of sodium chloride (NaCl), an alkali soluble resin (B), a polymerizable compound (C), a photopolymerization initiator (D), and a solvent (E), wherein the pigment is included at 40 mass % to 70 mass % with respect to the total solids of the colored curable composition, and the contact angle of water to a coated layer obtained from coating the colored curable composition on a substrate and drying is 60° or greater.

A second aspect of the present invention provides a colored pattern formed by slit coating the colored curable composition according to the first aspect, and a color filter comprising the same.

DETAILED DESCRIPTION OF THE INVENTION

The present invention is made in view of the above related art, with the objective of achieving the following.

An object of the present invention is to provide a colored curable composition excellent in pigment dispersibility and dispersion stability even when a pigment that has been made fine is included therein, suppressing the generation of foreign matter and the like in slit coating, and to provide a colored curable composition capable of forming a highly uniform colored layer, with excellent cleanability and solubility of such a dry colored layer. Further objectives of the present invention are to provide a colored pattern which can attain uniform hue, using the above colored curable composition in which the generation of foreign matter is suppressed, and to provide a color filter of superior contrast provided with such a colored pattern.

As a result of investigations, the inventors have discovered that the above issues are addressed by controlling the physical properties of the formed dry coated layer, and have thereby completed the present invention. That is, the present invention is configured as follows. A first embodiment of the colored photosensitive composition of the present invention is <1> a colored curable composition containing a pigment (A) made into fine particles in the presence of sodium chloride (NaCl), an alkali soluble resin (B), a polymerizable compound (C), a photopolymerization initiator (D), and a solvent (E). <1> The colored photosensitive composition includes the pigment (A) made into fine particles in the presence of sodium chloride (NaCl) at 40 mass % to 70 mass % relative to the total solids component of the colored curable composition, and the contact angle of water to a coated layer obtained by coating the colored curable composition on a substrate and drying is 60° or greater.

Other preferable embodiments of the present invention are as follows.
<2> The colored photosensitive composition of <1> in which the surface roughness of the coated layer obtained when the colored curable composition is coated on a substrate and dried is in the range of from 0.1 nm to 8 nm.
<3> The colored photosensitive composition of (1) where a pigment is used in which there is a polymer compound present when the pigment is made fine, in addition to the sodium chloride.
<4> The colored photosensitive composition of (1) further containing a polymer dispersant (F).
<5> The colored photosensitive composition of (1) in which the volume based median particle size (D50) of the sodium chloride is 1 to 50 μm and the 95 percentile particle size (D95) thereof is 80 μm or less.
<6> The colored photosensitive composition of (1) in which the amount of magnesium contained in the sodium chloride is in the range of 0.002 mass % to 0.08 mass %.

The colored pattern of the present invention is one formed by slit coating any one of the colored curable compositions (1) to (6), applying energy thereto and curing. Such a colored pattern is applicable to image forming for color proofs or the like, or for the colored pixels and light-blocking layer of a color filter.

The color filter of the present invention is one provided with the colored pattern of the present invention on a substrate.

Such a color filter is applicable to liquid crystal display devices and solid-state image sensing devices.

Since the colored curable composition of the present invention includes the pigment (A) obtained with the specific manufacturing method, the dispersibility of the pigment is excellent and the color characteristics of a coated layer formed therefrom are also excellent. Furthermore, a coated layer obtained by coating the colored curable composition of the present invention to a surface of a solid body and drying has a contact angle to water of 60° or greater and has excellent lipophilicity. Therefore, since the dried coated layer dissolves and disperses rapidly on contact with a solvent, the generation of foreign matter resulting from nozzle blockages when slit coating is suppressed, there is excellent suitability for slit coating, and there is excellent cleanability and removability of the dried coated layer that has not yet undergone a curing reaction Accordingly, a colored pattern obtained by coating the colored photosensitive composition on a substrate, exposing to light and hardening is uniform with excellent transparency, and also good pattern forming characteristics. Therefore, such a colored pattern is appropriately used for forming the colored regions of a color filter, namely for forming the colored pixels and black matrix thereof, where not only image forming materials but also excellent color characteristics are called for. The excellent suitability to slit coating means that color filters of large surface area for liquid crystal displays and the like may be manufactured with good productivity, and the colored pattern is particularly useful for such applications.

BEST MODE OF CARRYING OUT THE INVENTION

The present invention will now be explained in detail.
The colored photosensitive composition of the present invention is a colored curable composition including a pigment (A) made into fine particles in the presence of sodium chloride (NaCl), an alkali soluble resin (B), a polymerizable compound (C), a photopolymerization initiator (D) and a solvent (E), wherein the pigment (A) is included at 40 mass % to 70 mass % with respect to the total solids of the colored curable composition, and the contact angle of the coated layer, obtained by coating the colored curable composition on a substrate and drying, to water is 60° or greater.

The present invention includes controlling the contact angle to water of the dry coated layer, obtained by coating and drying the colored curable composition, to within a specific range. The contact angle in the present invention is a value measured by the following method.

(Measurement Method of Contact Angle with Water)

The colored curable composition is coated on a glass substrate so as to form a layer of 1.5 μm layer thickness, dried for 60 seconds in a 90° C. oven, and a dry coated layer is formed. The dry coated layer is contacted with water at room temperature (25° C.), and the contact angle is measured using a Drop Master DM500 (trade name, made by Kyowa Interface Science Co., Ltd.) as the static contact angle 5 minutes after DIW (deionized water) is dripped onto the dried layer.

The colored curable composition of the present invention, as described above, is one containing a large amount of pigment. In order to control the contact angle with water of the dry coated layer from the colored curable composition so as to be 60° or greater, it is important to use particle-micronization treatment of the pigment in the presence of sodium chloride. However, the following measures can normally be adopted for this micronization treatment, such as: carrying out micronization treatment of the pigment in the presence of a polymer compound used as a polymer dispersant; controlling the average primary particle size of the pigment to 100 nm or less as well as suppressing secondary aggregation; and/or adding a polymer dispersant with excellent lipophilicity.

By such techniques, the slit coating suitability is improved of the composition which includes a high-concentration of fine pigment, aggregation and foreign matter generation are suppressed during the coating process, and since a uniform dry coated layer is formed with a smooth surface, a dry coated layer may be formed whose contact angle with water is 60° or greater.

More specifically, the contact angle with water of the dried coated layer can be adjusted to 60° or greater by adopting the following measures.

(a) Using an organic pigment made fine in the presence of sodium chloride having a specific particle size.

(b) Dispersing the pigment using a pigment dispersant having within its molecule a structure with attraction to a pigment, such as having an organic dye structure or heterocyclic structure, and having plural structures such as a heterocyclic structure, a urea group, a urethane group, a hydrocarbon group with 4 or more carbon atoms, an alkoxy silyl group, an epoxy group, an isocyanate group, or an ionic functional group, such as a dispersant like the specific dispersion resin (B-1) proposed previously by the present applicant in the specification of Japanese Patent Application Laid-Open No. 2008-096678.

The dry coated layer of the colored curable composition of the present invention preferably has a smooth surface for the above stated reason, and more specifically the surface roughness of the coated layer obtained by coating the colored curable composition on to a substrate and drying is preferably in the range of 0.1 nm to 8 nm. The surface roughness is the center line average roughness (Ra) measured using a Nano Scope IIIa (AFM) device (trade name, made by Digital Instruments) with a 10 μm angle area. Each of the components included in the colored curable composition of the present invention with now be explained in sequence.

<Pigment (A), Made into Fine Particles in the Presence of Sodium Chloride (NaCl)>

The pigment used as a colorant in the colored curable composition of the present invention is a pigment made into fine particles in the presence of sodium chloride (NaCl). Namely, a pigment is used that has been obtained by: mixing together i) a pigment, ii) sodium chloride and iii) a small amount of a water soluble organic solvent that does not dissolve the sodium chloride, and, as desired, a polymer dispersant used for dispersing pigments, and mechanically mixing and kneading this mixture with a kneader (this process is referred to as salt milling); placing the resultant mixture in water and agitating, using a high speed mixer or the like, to form into a slurry state; and filtering and washing the slurry with water and then drying.

Explanation will now be given of the raw materials and manufacturing method used for the pigment (A) made into fine particles in the presence of sodium chloride (NaCl) of the present invention.

[i) Pigment]

Various conventional inorganic pigments or organic pigments can be suitably selected and used for the pigment used in the present invention. High transmissivity is preferable for a pigment when the processed pigment of the present invention is used for the colored pattern of a color filter, and in consideration thereof, such a pigment is preferably an organic pigment and also preferably a pigment with as small a particle size as possible. When such factors as the handling characteristics of the photosensitive composition containing a pigment dispersion composition are taken into consideration, the average primary particle size of processed pigment is preferably 100 nm or less, 30 nm or less is more preferable, and 5 nm to 25 nm is the most preferable. Transmissivity is high and color characteristics are good when the particle size is within these ranges, and so such a pigment is effective for forming a color filter of the high contrast. The average primary particle size is derived by observation using a SEM or TEM, measuring the size of 100 particles in portions where particles are not aggregated together, and computing the average primary particle size thereof. It should be noted that the particle size of the pigment before milling is about 100 nm to 300 nm.

Examples of the inorganic pigment include metal oxides, metal complex salts, and other metal compounds. Specifically, the pigment is, for example, an oxide of a metal such as iron, cobalt, aluminum, cadmium, lead, copper, titanium, magnesium, chromium, zinc or antimony, or a complex oxide of the metal.

Examples of the organic pigment may include:

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279;

C. I. Pigment Yellows 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214;

C. I. Pigment Orange 2, 5, 13, 16, 17:1, 31, 34, 36, 38, 43, 46, 48, 49, 51, 52, 55, 59, 60, 61, 62, 64, 71, 73;

C. I. Pigment Green 7, 10, 36, 37;

C. I. Pigment Blue 1, 2, 15, 15:1, 15:2, 15:3, 15:4, 15:6, 16, 22, 60, 64, 66, 79, a substituted one of Pigment Green 79 with hydroxyl group instead of chloro-group, 80;

C. I. Pigment Violet 1, 19, 23, 27, 32, 37, 42;

C. I. Pigment Brown 25, 28;

C. I. Pigment Black 1, 7.

However, in the invention, examples of the organic pigment are not limited to the described examples.

Among above, preferable examples of the organic pigment in the exemplary embodiments of the present invention may include:

C. I. Pigment Yellows 11, 24, 108, 109, 110, 138, 139, 150, 151, 154, 167, 180, 185;

C. I. Pigment Orange 36, 71;

C. I. Pigment Reds 122, 150, 171, 175, 177, 209, 224, 242, 254, 255, 264;

C. I. Pigment Violet 19, 23, 32;

C. I. Pigment Blues 15:1, 15:3, 15:6, 16, 22, 60, 66;

C. I. Pigment Green 7, 36, 37;

C. I. Pigment Black 1, 7.

These organic pigments may be used alone or, to raise the color purity, may be used in combinations of two or more thereof. Specific examples of such combinations are described below.

For example, red pigments that can be used as a single pigment include an anthraquinone pigment, a perylene pigment, and a diketopyrrolopyrrole pigment, and one or more of these pigments may be used in combination with a disazo yellow pigment, an isoindoline yellow pigment, a quinophthaline yellow pigment, or a perylene red pigment, an anthraquinone red pigment, and/or a diketopyrrolopyrrole pigment. For example, the anthraquinone pigment may be C. I. Pigment Red 177, the perylene pigment may be C. I. Pigment Red 155 or C. I. Pigment Red 224, and the diketopyrrolopyrrole pigment may be C. I. Pigment Red 254. From the viewpoint of color reproducibility, a combination thereof with C. I. Pigment Yellow 83, C. I. Pigment Yellow 139 or C. I. Pigment Red 177 is preferable. The ratio by mass of the red pigment to the yellow pigment is preferably from 100:5 to 100:80. When the ratio is 100:4 or below, it is difficult to suppress transmittance of light from 400 nm to 500 nm, and sometimes the color purity cannot be raised. Furthermore, if the ratio is 100:81 or above, then sometimes the color strength falls. In particular, the above mass ratio is optimally in the range of 100:10 to 100:65. When a combination of red pigments is used adjustments may be made according to the chromaticity thereof.

Examples of a green pigment that can be used include a halogenated phthalocyanine pigment used alone, and a halogenated phthalocyanine pigment used in combination with a disazo yellow pigment, a quinophthalone yellow pigment, an azomethine yellow pigment and/or an isoindoline yellow pigment.

Such examples include a mixture of C. I. Pigment Green 7, 36 or 37 with C. I. Pigment Yellow 83, 138, 139, 150, 180 or 185. The ratio by mass of green pigment to yellow pigment is preferably from 100:5 to 100:200. When the ratio is less than 100:5, it becomes difficult to suppress transmittance of light from 400 nm to 450 nm, and sometimes the color purity cannot be raised. Furthermore, if the ratio exceeds 100:200, the main wave length is biased to the long wavelength side, and sometimes there is a large difference to the target NTSC hue. The range of 100:20 to 100:150 is particularly preferable for the above mass ratio.

Examples of a blue pigment include a phthalocyanine pigment used alone, or a phthalocyanine pigment used in combination with a dioxazine violet pigment.

A preferable example is a combination of C. I. Pigment Blue 15:6 with C. I. Pigment Violet 23. The ratio by mass of the blue pigment to the violet pigment is preferably from 100:0 to 100:100, and 100:70 or below is more preferable.

Suitable pigments for use in a black matrix include carbon black, graphite, titanium black, iron oxide, or titanium oxide, either used singly or in combinations thereof, and a combination of carbon black and titanium black is preferable. The mass ratio of carbon black to titanium black is preferably in the range of 100:0 to 100:60. When the mass ratio is greater than 100:61 the dispersion stability may be reduced.

[ii] Sodium Chloride]

The ii) sodium chloride used in salt milling in the present invention preferably has a volume basis median particle size (D50) of 1 μm to 50 μm, a 95 percentile particle size (D95) of 80 μm or less, and an Mg content of 0.002 mass % to 0.08 mass %. The sodium chloride functions as a milling auxiliary when the organic pigment is made into fine particles. The volume basis median particle size (D50) of the sodium chloride is preferably 1 μm to 20 μm, and the 95 percentile particle size (D95) is preferably 30 μm or less. Further, when a color filter with a particularly high contrast ratio is called for, the sodium chloride used in particle-micronization treatment of an organic pigment should also be fine, with sodium chloride of volume basis median particle size (D50) of 1 μm to 10 μm and 95 percentile particle size (D95) of 20 μm or less preferably used therefor.

If the median particle size (D50) of the sodium chloride is larger than 50 μm, then the fine organic pigment cannot be obtained of the desired fineness with uniform particle size regulation. However, in order to provide the sodium chloride with a median particle size of less than 1 μm, a large amount of energy is required in a special pulverizer, and it is difficult to obtain such sodium chloride. If the 95 percentile particle size (D95) of the sodium chloride exceeds 80 μm, the number of course large sodium chloride particles increases, causing reduced milling efficiency and making it difficult to obtain the desired fine pigment. The lower limit of the 95 percentile particle size (D95) of sodium chloride is the median particle size (D50).

The volume basis median particle size of the sodium chloride and the 95 percentile particle size of the sodium chloride are computed from the particle size distribution measured using a laser diffraction particle size analyzer (trade name: MICROTRAC; made by Nikkiso Co., Ltd.), and the D50 and D95 particle sizes are sizes such that 50% and 95%, respectively, of the total particles are smaller than these sizes. Factors influencing the particle-micronization of the organic pigment are not only the particle size of the sodium chloride, but an important factor is also the shape of the sodium chloride. Namely, for equivalent particle sizes of sodium chloride, a fine organic pigment with fine and uniform regulated particle size can be more easily manufactured by mixing and kneading with angular shaped solid sodium chloride bodies than with non-angular and rounded sodium chloride bodies. Accordingly, the particle shape of the sodium chloride preferably is a shape near to that of a tetrahedron, such as a rectangular parallelepiped, or when an irregular shape, a shape with sharp projections is preferably; spheres, needle shapes, and polygons with gentle faces, such as hexagons and dodecahedrons, are not preferable.

Sodium chloride with a volume basis median particle size (D50) of 1 μm to 50 μm and a 95 percentile particle size (D95) of 80 μm or less can be obtained by pulverizing raw sodium chloride of a large particle size, and the shape of the pulverized sodium chloride depends on the Mg content in the raw sodium chloride. When the Mg content in the raw sodium chloride is greater than 0.08 mass %, a shape is formed in which the angles are rounded off, and the surface also becomes smooth. However, when raw sodium chloride with Mg content of 0.08 mass % or less is pulverized, angular sodium chloride particles with rough surfaces are obtained. Sodium chloride with small Mg content of less than 0.002 mass % is of reagent quality and is of high cost, and so is not readily applicable industrially. Therefore, the sodium chloride used for salt milling in the present invention is sodium chloride whose Mg content is in the range of from 0.002 mass % to 0.08 mass %, and a Mg content in the range of from 0.005 mass % to 0.05 mass % is preferable.

The amount of moisture contained is also important with respect to the quality of the sodium chloride used. A moisture content of 1.0 mass % or above is usual for ordinary industrial salt, and when sodium chloride with an amount of moisture contained of more than 1.0 mass % is pulverized without drying the adhesion of the pulverized sodium chloride is strong, and when this is then left to stand it will often solidify. Such solidified sodium chloride is not preferable since it leads to a reduction in the efficiency of particle-micronization treatment. Therefore, the sodium chloride is preferably dried to a moisture content of 0.5 mass % or less, so that there is no mutual aggregation or attraction of the pulverized sodium chloride, and so that the sodium chloride maintains the particle size of the time of grinding. Drying to an amount of moisture contained of 0.3 mass % or less is more preferable, and particularly preferable is sintering the sodium chloride at high temperature such that the amount of moisture contained becomes 0.2 mass % or less.

High velocity rotary mills, such as a hammer mill or a pin mill, are commonly used as the pulverizer for pulverizing the sodium chloride, however, there are no limitations to the kind of pulverizer used. The amount of the sodium chloride used depends on the type of organic pigment used, however 1 to 30 parts by mass of sodium chloride to 1 part by mass of organic pigment is preferable, and 5 to 15 parts by mass sodium chloride to 1 part by mass of organic pigment is more preferable. The larger the proportion of sodium chloride to the organic pigment, the greater the micronization effect, however the pigment throughput per cycle decreases, leading to a higher cost.

In the present invention, a high quality fine organic pigment may be manufactured without increasing the amount of the sodium chloride used in comparison to conventional technology by using the specific ii) sodium chloride, in which the particle shape is also controlled as described above, by using a specific particle size, Mg content, and moisture content therefor.

[iii) Water Soluble Organic Solvent]

The iii) water soluble organic solvent used in salt milling treatment is used for making the mixture of organic pigment and sodium chloride suitably hard, and there are no particular limitations to the water soluble organic solvent as long as it dissolves in water and sodium chloride substantially does not dissolve therein. Specific preferable examples of the water soluble organic solvent include high viscosity water soluble organic solvents, such as ethylene glycol, diethylene glycol, and polyethylene glycol. Although the amount of the water soluble organic solvent used depends on the kind of organic pigment, and addition amount of the sodium chloride, the amount is generally 0.1 parts to 5 parts by mass of water soluble organic solvent to 1 part by mass of organic pigment, and 1 to 2 parts by mass of water soluble organic solvent to 1 part by mass of organic pigment is preferable.

The temperature during particle-micronization treatment of the organic pigment is preferably 120° C. or lower with regard to the efficiency with which the organic pigment is made fine, and 20° C. to 70° C. is particularly preferable. Although processing time depends on the kind of organic pigment and on the particle size of the sodium chloride, the processing time is about 2 to 20 hours.

The equipment used for mixing and kneading the mixture of the i) organic pigment, ii) sodium chloride, and iii) water soluble organic solvent may be any equipment capable of mechanically pulverizing the organic pigment, and examples thereof include a two-roll mill, a three-roll mill, a ball mill, a Tron mill, a disper, a kneader, a co-kneader, a homogenizer, a blender, a single-shaft extruder or a two-shaft extruder. Among these, the use of a kneader is typical. Besides these, commercially available equipment can also be used, such as batch type kneading machine like a SUPER MIXER (trade name, made by Kawata Manufacturing Co., Ltd.) or a TRI-MIX (trade name, made by Inoue Manufacturing Co., Ltd.), and continuous kneading machines like a KCK mill (trade name, made by Asada Iron Works Co., Ltd.). Devices other than these may also be used. iv) a polymer dispersant described previously, a resin, a surfactant, or the like, may be added as required before, or during, the mixing and kneading of the mixture of the organic pigment, the sodium chloride, and the water soluble organic solvent. Usual polymer dispersants which are added during pigment dispersion, such as a described later polymer dispersant (F), may be used as the iv) polymer dispersant used here. The timing for adding the iv) polymer dispersant may be that of adding all of the dispersant at an early stage of the salt milling process, or the dispersant may divided into portions thereof and added in stages. Pulverized pigments obtained in the presence of the polymer dispersant are ones in which the surfaces of the pigment particles are covered with the polymer dispersant, and the dispersibility and dispersion stability of the obtained pigments are further improved.

There are no particular limitations to any resin which might be added in the salt milling process, and examples thereof include a rosin, a rosin derivative, a rosin modified maleic acid resin, a rosin-modified phenolic resin, a rubber derivative, a protein derivative, chlorinated polyethylene, chlorinated polypropylene, polyvinyl chloride, polyvinyl acetate, an epoxy resin, an acrylic resin, a maleic acid resin, a styrene resin, a styrene-maleic acid copolymer resin, a butyral resin, a polyester resin, a melamine resin, a phenol resin, a polyurethane resin, a polyamide resin, a polyimide resin, an alkyd resin, a rubber resin, celluloses, a benzoguanamine resin, a urea resin, and oligomers of the above resins or monomers that configure such resins.

The product obtained after mixing and kneading the mixture of the organic pigment, the sodium chloride, and the water soluble organic solvent is generally filtered and washed with water so as to extract organic pigment particles that have been micronized to an average primary particle size of about 0.01 μm to 0.5 μm, and so as to remove the sodium chloride and the water soluble organic solvent. First, the kneaded material is placed in water and heated until the sodium chloride is completely dissolved. There are no particular limitations to the heating temperature and amount of warm water, as long as the sodium chloride can be completely dissolved. Next, filtering and washing with water is carried out thereto using a filter device, such as a filter press, and the sodium chloride and the water soluble organic solvent are sufficiently removed. The amount of cleaning carried out can be adjusted during washing with the conductivity of the filtrate or the like.

The press cake taken out from the filter device, such as a filter press, may be further pulverized with a hammer mill or the like, dried with a compartment dryer or a band dryer, and used as the powdered fine organic pigment. Water may also be re-added to the press cake and, after making into a slurry, dried with a spray dryer and used as the powdered fine organic pigment.

The pigment (A) made into fine particles in the presence of sodium chloride (NaCl) obtained in this manner is excellent in dispersion stability. A single pigment of the pigment (A) made into fine particles in the presence of sodium chloride (NaCl) may be included in the colored curable composition of the present invention, or two or more thereof may be used according to the purpose, however, the pigment(s) in the colored curable composition should be 40 mass % or more with respect to the total solids of the curable composition. The pigment is preferably from about 40 mass % to about 70 mass % with respect to the total solids of the curable composition, and more preferably from about 45 mass % to about 60 mass % thereof from the standpoint of attaining the hue, the color characteristics and the physical property values described above of a colored pattern obtained therewith.

The pigment (A) made into fine particles in the presence of sodium chloride (NaCl) may be added as it is to the colored curable composition. However, from the standpoint of the dispersibility of the pigment, it is preferable, after preparing a pigment dispersion composition in advance, to mix this with other materials, for example with the alkali soluble resin (B), the polymerizable compound (C), the photopolymerization initiator (D), the solvent (E), and the like, and to prepare the colored curable composition therewith.

<Pigment Dispersion Composition>

The pigment dispersion composition of the present invention will now be explained.

The pigment dispersion composition of the present invention is formed by dispersing the above processed pigment of the present invention in an organic solvent.

A preferable embodiment is to additionally use, as required, a pigment derivative or a pigment dispersant suitably when dispersing the processed pigment of the present invention in the organic solvent. The amount contained of the (A) specific pigment according to the present invention in the pigment dispersion composition is suitably selected according to the application and the like of the pigment dispersion composition. Specifically, when the application is for a liquid crystal color display, the amount contained of pigment in the pigment dispersion composition is preferably 5 mass % to 50 mass %, is more preferably 10 mass % to 30 mass %, and is still more preferably 10 mass % to 20 mass % from the standpoints of the color reproduction region and ease of handling (viscosity).

[Organic Solvent]

There are no particular limitations to the organic solvent used with the pigment dispersion composition, and known organic solvents may be suitably selected. Examples thereof include: (poly)alkylene glycol monoalkyl ethers, such as 1-methoxy-2-propyl acetate, 1-methoxy-2-propanol, ethylene glycol monomethyl ether, ethylene glycol monoethyl ether, propylene glycol monomethyl ether, propylene glycol monoethyl ether, diethylene glycol monomethyl ether, and ethylene glycol monoethyl ether; acetate esters, such as ethyl acetate, n-propyl acetate, i-propyl acetate, n-butyl acetate, and i-butyl acetate; aromatic hydrocarbons, such as benzene, toluene and xylene; ketones, such as methyl ethyl ketone, acetone, methyl isobutyl ketone, and cyclohexanone; alcohols, such as ethanol, propanol, butanol, hexanol, cyclohexanol, ethylene glycol, diethylene glycol, and glycerin; and the like. Preferable examples from among these are alkylene glycol monoalkyl ethers, acetate esters thereof, acetate esters, and methyl ethyl ketone. These organic solvents may be used singly or in combinations of two or more thereof.

The amount contained of the organic solvent in the pigment dispersion composition of the present invention is suitably selected according to the application and the like of the pigment dispersion composition. When the pigment dispersion composition is used for preparation of the later described photosensitive composition, the solids concentration contained of the processed pigment and the dispersant and the like in the pigment dispersion composition may be 5 mass % to 50 mass %, from the standpoint of handling characteristics.

[Pigment Derivative]

A pigment derivative may be added, as required, when preparing the pigment dispersion composition. In the present invention, the pigment may be dispersed in the pigment dispersion composition as fine particles by adsorbing a pigment derivative, into which a portion having affinity to the dispersant or a polar group has been introduced, to the surface of the pigment, and using the pigment derivative as sites for adsorbing the dispersant, and re-aggregation thereof may also be prevented thereby. Namely, using the pigment derivative for improving the pigment surface has the effect of promoting adhesion of the polymer dispersant. Therefore, a pigment dispersion composition containing a pigment derivative is useful for forming a color filter with high contrast and excellent transparency.

[Polymer Dispersant (F)]

A known pigment dispersant (F) can also be added to the pigment dispersion composition useful for preparing the colored photosensitive composition of the present invention, in order to further raise the dispersibility of the pigment. Examples of such known pigment dispersants include polymer dispersants, (such as, for example, polyamideamine and salts thereof, polycarboxylic acid and salts thereof, a high molecular weight unsaturated acid ester, a modified polyurethane, a modified polyester, a modified poly(meth)acrylate, a (meth)acrylate copolymer, or a naphthalenesulfonic acid formaldehyde condensate), and polyoxyethylene alkyl phosphate esters, polyoxyethylene alkylamines, alkanolamines and the like. Polymer dispersants can be further classified into straight chain polymers, terminal modified polymer compounds, graft type polymer compounds, and block polymer compounds according to their structures.

Polymer dispersants act by adsorbing to the surface of a pigment thereby preventing pigment re-aggregation. Examples of preferable structures thereof having an anchoring site to the pigment surface include terminal modified polymer compounds, graft polymer compounds, and block polymer compounds. Explanation will now be given of block polymer compounds, graft type polymer compounds and terminal modified polymer compounds that are suitable as polymer dispersants for the present invention.

(Block Polymer Compound)

There are no particular limitations to block polymer compounds used as the polymer dispersant, and block polymers with pigment adsorbing blocks and block polymers with non-pigment adsorbing blocks can be used. There are no particular limitations to monomers which configure such pigment adsorbing blocks, and, for example, monomers can be used which have a pigment adsorbing functional group. Specific examples thereof include monomers having an organic dye structure or a heterocyclic structure, monomers having an acidic group, monomers having a basic nitrogen atom, and the like. Explanation will now be given of monomers having an organic dye structure or a heterocyclic structure, monomers having an acidic group, and monomers having a basic nitrogen atom, which are preferable monomers for configuring a pigment adsorbing block.

Examples of monomers having an organic dye structure or a heterocyclic structure include: phthalocyanine-, insoluble azo-, azo lake-, anthraquinone-, quinacridone-, dioxazine-, diketopyrolopyrrole-, anthrapyridine-, anthanthrone-, indanthrone-, flavanthrone-, perinone-, perylene- and thioindigo- dye structures; and heterocyclic structure such as thiophene, furan, xanthene, pyrrole, pyrroline, pyrrolidine, dioxolane, pyrazole, pyrazoline, pyrazolidine, imidazole, oxazol, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolone, benzothiazole, succinic imide, phthalimide, naphthalimide, hydantoin, indole, quinoline, carbazole, acridine, acridone, and anthraquinone.

Although there are no particularly limitations, more specific examples of such a monomer include the following structures.

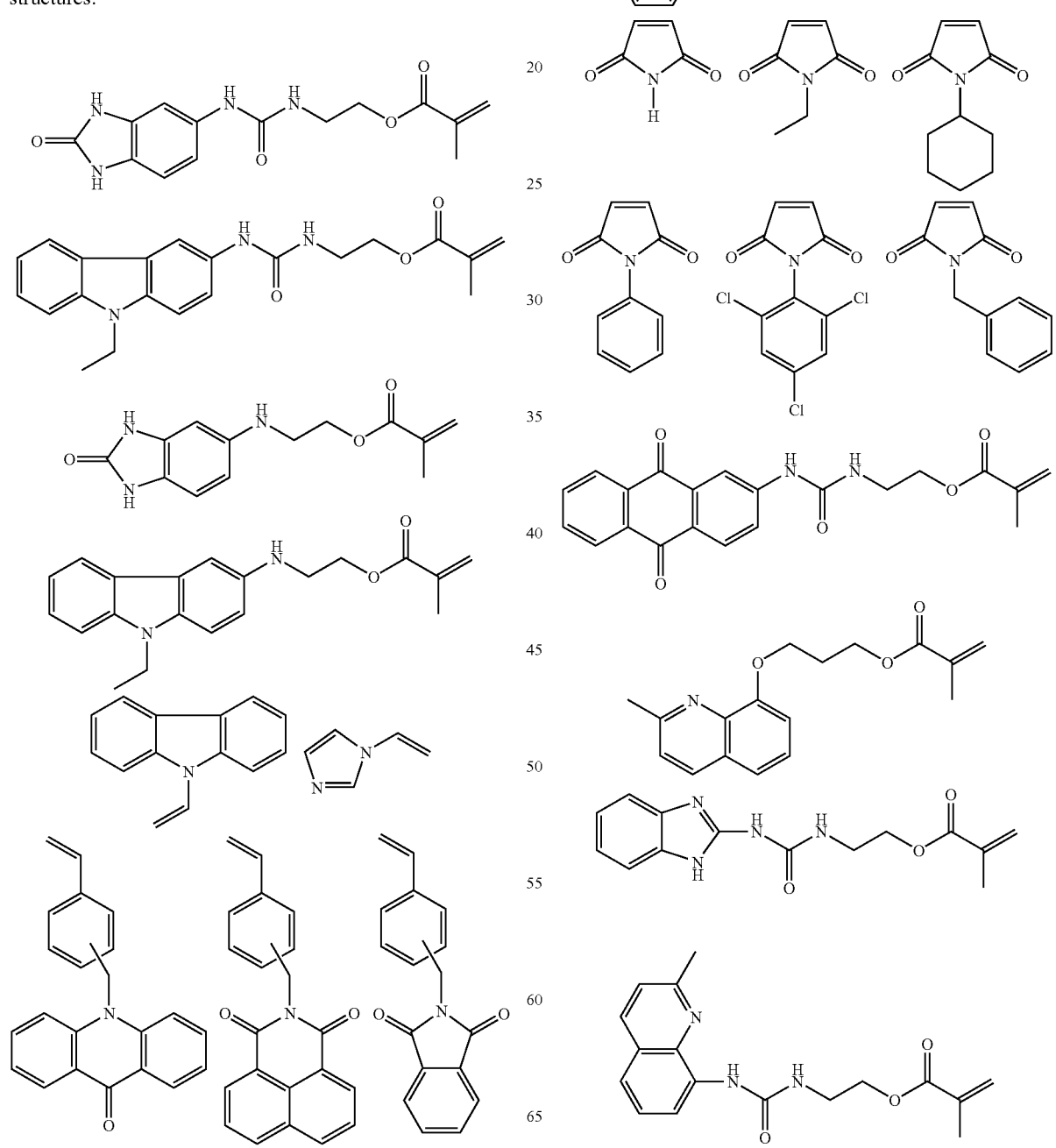

-continued

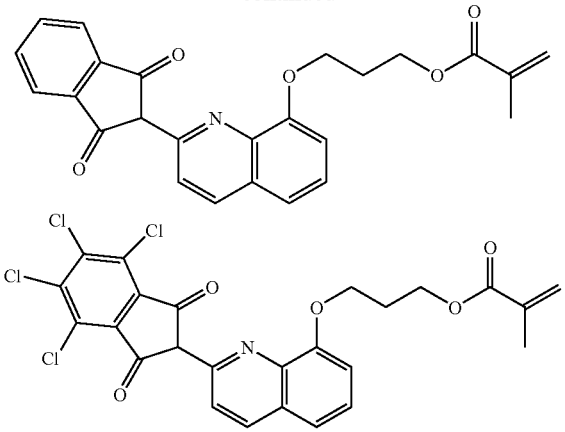

Examples of monomers having an acidic group include a vinyl monomer having a carboxyl group, a vinyl monomer having a sulfonic acid group, and a vinyl monomer having a phosphoric acid group. Examples of vinyl monomers having a carboxyl group include (meth)acrylic acid, vinylbenzoic acid, maleic acid, maleic acid monoalkyl ester, fumaric acid, itaconic acid, crotonic acid, cinnamic acid, an acrylic acid dimer and the like. Addition products of hydroxyl group containing monomers, such as 2-hydroxyethyl(meth)acrylate with cyclic anhydrides, such as maleic anhydride, phthalic anhydride, and cyclohexanedicarboxylic anhydride, may also be used, and co-carboxy-polycaprolactone mono(meth)acrylate and the like may also be used. Anhydride containing monomers, such as maleic anhydride, itaconic anhydride, and citraconic anhydride, may also be used as a precursor of a carboxyl group. (Meth)acrylic acid is particularly preferable from the standpoints of ability to form a copolymer, cost, solubility, and the like.

Examples of vinyl monomers having a sulfonic acid group include 2-acrylamido-2-methylpropanesulfonic acid and the like, and examples of vinyl monomers having a phosphoric acid group include phosphate mono(2-acryloyloxyethyl ester) and phosphate mono(1-methyl-2-acryloyloxyethyl ester), and the like.

Examples of monomers having a basic nitrogen atom that can be used include: heterocycle containing monomers, such as vinylpyridine, vinylimidazole, vinyltriazole and the like; and (meth)acrylate esters, such as N,N-dimethylaminoethyl (meth)acrylate, N,N-dimethylaminopropyl (meth)acrylate, 1-(N,N-dimethylamino) -1, 1-dimethylmethyl (meth)acrylate, N,N-dimethylaminohexyl (meth)acrylate, N,N-diethylaminoethyl (meth)acrylate, N,N-diisopropyl-aminoethyl (meth)acrylate, N,N-di-n-butylaminoethyl (meth)acrylate, N,N-di-isobutylaminoethyl (meth)acrylate, morpholinoethyl (meth)acrylate, piperidinoethyl (meth)acrylate, 1-pyrrolidinoethyl (meth)acrylate, N,N-methyl-2- pyrrolidylaminoethyl (meth)acrylate, N,N-methyl-phenylaminoethyl (meth)acrylate, and the like; (meth)acrylamides, such as N-(N', N'-dimethylaminoethyl) acrylamide, N-(N', N'-dimethylaminoethyl) methacrylamide, N-(N', N'-diethyl aminoethyl) acrylamide, N-(N', N'-diethyl aminoethyl) methacrylamide, N-(N', N'-dimethylaminopropyl) acrylamide, N-(N', N'-dimethylaminopropyl) methacrylamide, N-(N', N'-diethylaminopropyl) acrylamide, N-(N',N'-diethylaminopropyl) methacrylamide, 2-(N, N-dimethylamino) ethyl (meth)acrylamide, 2-(N, N-diethylamino) ethyl (meth)acrylamide, 3-(N, N-diethylamino) propyl (meth)acrylamide, 3-(N, N-dimethylamino) propyl (meth)acrylamide, 1-(N, N-dimethylamino)-1,1- dimethylmethyl (meth)acrylamide and 6-(N, N-diethylamino) hexyl (meth)acrylamide, morpholino (meth)acrylamide, piperidino (meth)acrylamide, N-methyl-2-pyrrolidyl (meth)acrylamide; styrenes, such as N, N-dimethylamino styrene and N, N-dimethylamino methylstyrene; and the like.

A monomer having a hydrocarbon group with 4 or more carbon atoms containing a urea group, a urethane group, and an oxygen ligand, or a monomer containing an alkoxy silyl group, an epoxy group, an isocyanate group, or a hydroxyl group, can also be used.

Specific examples include monomers of the following structures.

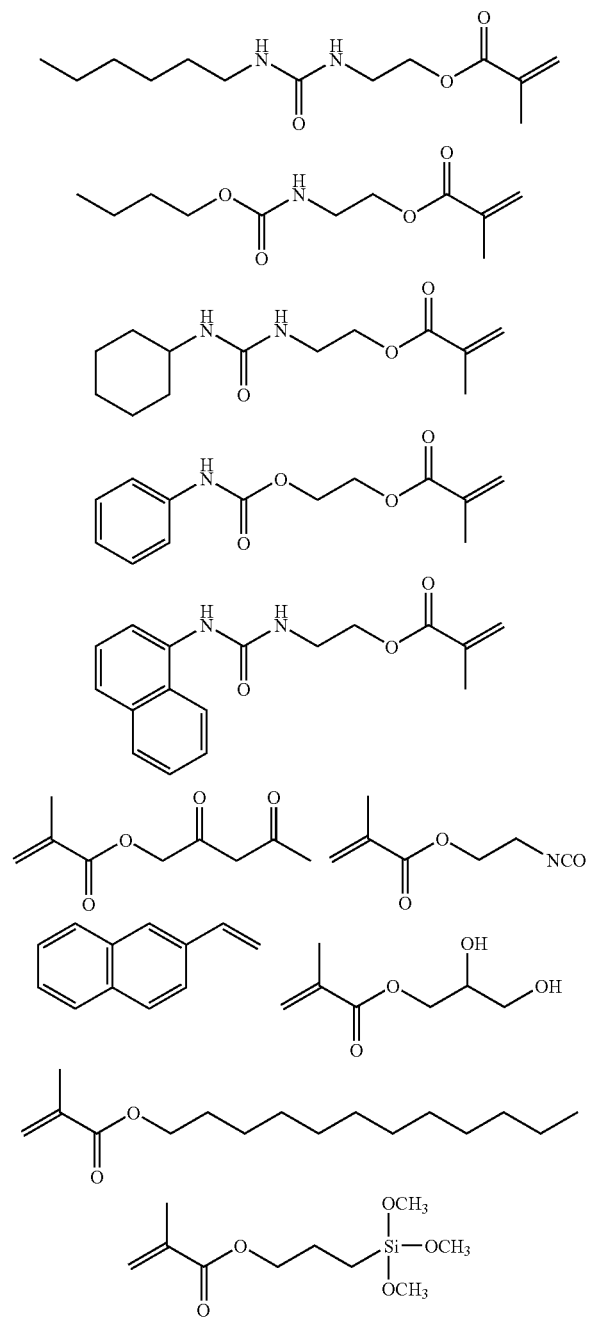

-continued

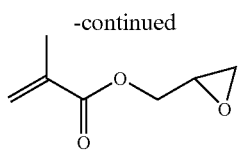

Monomers containing an ionic functional group can be used. Examples of ionic vinyl monomers (anionic vinyl monomers and cationic vinyl monomers) include anionic vinyl monomers, such as alkali metal salts of the above vinyl monomers having acidic groups and salts of organic amines (for example, tertiary amines, such as triethylamine and dimethylamino ethanol), and cationic vinyl monomers, such as nitrogen-containing vinyl monomers quaternerized with: an alkyl halide (alkyl group: 1 to 18 carbon atoms, halogen atom: chlorine atom, bromine atom or iodine atom); a benzyl halide, such as benzyl chloride or benzyl bromide; an alkylsulfonate (alkyl group: 1 to 18 carbon atoms), such as methanesulfonate; an alkyl arylsulfonate (alkyl group: 1 to 18 carbon atoms), such as benzenesulfonate or toluenesulfonate; a dialkyl sulfate (alkyl group: 1 to 4 carbon atoms); or the like, and dialkyl diaryl ammonium salts and the like.

The above monomers having a functional group for adsorbing to the pigment may be selected appropriately according to the type of dispersed pigment, and may be used singly or in combinations of two or more thereof.

There are no particular limitations to the monomer configuring a non-pigment adsorbing block (c) and monomers that can be used include, for example: (meth)acrylate esters, crotonic acid esters, vinyl esters, maleic acid diesters, fumarate diester, itaconic acid diesters, (meth)acrylamides, styrenes, vinyl ethers, vinyl ketones, olefins, maleimides, (meth)acrylonitrile and the like.

The monomers that configure a non-pigment adsorbing block may be used singly, or in combinations of two or more thereof. When applying to a pigment dispersion composition requiring alkaline development treatment, a monomer configuring a block which does not adsorb to the above pigment may be used together with a vinyl monomer having acidic group.

Examples of (meth)acrylate esters include methyl(meth)acrylate, ethyl(meth)acrylate, n-propyl(meth)acrylate, isopropyl(meth)acrylate, n-butyl(meth)acrylate, isobutyl(meth)acrylate, t-butyl(meth)acrylate, amyl(meth)acrylate, n-hexyl(meth)acrylate, cyclohexyl(meth)acrylate, t-butylcyclohexyl(meth)acrylate, 2-ethylhexyl(meth)acrylate, t-octyl(meth)acrylate, dodecyl(meth)acrylate, octadecyl(meth)acrylate, acetoxyethyl(meth)acrylate, phenyl(meth)acrylate, 4-hydroxybutyl(meth)acrylate, 2-methoxyethyl(meth)acrylate, 2-ethoxyethyl(meth)acrylate, 2-(2-methoxyethoxy) ethyl(meth)acrylate, 2-chloroethyl(meth)acrylate, vinyl(meth)acrylate, 2-phenylvinyl(meth)acrylate, 1-propenyl(meth)acrylate, allyl(meth)acrylate, 2-allyloxyethyl(meth)acrylate, propargyl(meth)acrylate, benzyl(meth)acrylate, diethylene glycol monomethyl ether(meth)acrylate, diethylene glycol monoethyl ether(meth)acrylate, triethylene glycol monomethyl ether(meth)acrylate, triethylene glycol monoethyl ether (meth)acrylate, polyethylene glycol monomethyl ether (meth)acrylate, polyethylene glycol monoethyl ether(meth) acrylate, β-phenoxyethoxyethyl(meth)acrylate, nonylphenoxypolyethylene glycol(meth)acrylate, dicyclopentenyl(meth)acrylate, dicyclopentenyl oxyethyl(meth) acrylate, trifluoroethyl(meth)acrylate, octafluoro pentyl (meth)acrylate, perfluoro octylethyl(meth)acrylate, dicyclopentanyl(meth)acrylate, tribromophenyl(meth)acrylate, tribromophenyloxyethyl(meth)acrylate, γ-butyrolactone (meth)acrylate, and the like.

Examples of crotonic acid esters include butyl crotonate, hexyl crotonate, and the like. Examples of vinyl esters include vinyl acetate, vinylchloro acetate, vinyl propionate, vinyl butyrate, vinyl methoxy acetate, vinyl benzoate, and the like. Examples of maleic acid diesters include dimethyl maleate, diethyl maleate, dibutyl maleate, and the like. Examples of fumaric acid diesters include dimethyl fumarate, diethyl fumarate, dibutyl fumaric, and the like. Examples of itaconic acid diesters include dimethyl itaconate, diethyl itaconate, dibutyl itaconate, and the like.

Examples of (meth)acrylamides include (meth)acrylamide, N-methyl(meth)acrylamide, N-ethyl(meth)acrylamide, N-propyl(meth)acrylamide, N-isopropyl(meth)acrylamide, N-n-butyl(meth)acrylamide, N-t-butyl(meth)acrylamide, N-cyclohexyl(meth)acrylamide, N-(2-methoxyethyl)(meth)acrylamide, N,N-dimethyl(meth)acrylamide, N,N-diethyl(meth)acrylamide, N-phenyl(meth)acrylamide, N-nitrophenyl acrylamide, N-ethyl-N-phenylacrylamide, N-benzyl(meth)acrylamide, (meth)acryloyl morpholine, diacetone acrylamide, N-methylolacrylamide, N-hydroxyethylacrylamide, vinyl(meth)acrylamide, N,N-diaryl(meth)acrylamide, N-allyl(meth)acrylamide, and the like.

Examples of styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, protected hydroxystyrenes that can be deprotected using an acidic group (for example, t-Boc or the like), vinylbenzoic acid methyl ester and α-methylstyrene, and the like.

Examples of vinyl ethers include methyl vinyl ether, ethyl vinyl ether, 2-chloroethyl vinyl ether, hydroxyethyl vinyl ether, propylvinyl ether, butyl vinyl ether, hexyl vinyl ether, octyl vinyl ether, methoxyethyl vinyl ether, phenyl vinyl ether, and the like.

Examples of vinyl ketones include methyl vinyl ketone, ethyl vinyl ketone, propyl vinyl ketone, phenyl vinyl ketone, and the like. Examples of olefins include ethylene, propylene, isobutylene, butadiene, isoprene, and the like. Examples of maleimides include maleimide, butylmaleimide, cyclohexyl maleimide, phenyl maleimide, and the like. Examples of (meth)acrylonitriles include methacrylonitrile, acrylonitrile, and the like.

Examples of vinyl monomers having an acidic group include vinyl monomers having a carboxyl group, vinyl monomers having a sulfonic acid group, and vinyl monomers having a phosphoric acid group. Examples of vinyl monomers having a carboxyl group include (meth)acrylic acid, vinylbenzoic acid, maleic acid, maleic acid monoalkyl ester, fumaric acid, itaconic acid, crotonic acid, cinnamic acid, acrylic acid dimer, and the like. Addition products of monomers having hydroxyl groups, such as 2-hydroxyethyl(meth)acrylate, with cyclic anhydrides, such as maleic anhydride, phthalic anhydride, and cyclohexanedicarboxylic anhydride, ω-carboxy-polycaprolactone mono(meth)acrylate and the like can also be used. Anhydride containing monomers, such as maleic anhydride, itaconic anhydride, and citraconic anhydride, may also be used as a precursor of a carboxyl group. (Meth)acrylic acids are particularly preferable from among these from the standpoints of ability to form a copolymer, cost, solubility and the like.

Examples of a vinyl monomer having a sulfonic acid group include 2-acrylamido-2-methylpropanesulfonic acid and the like, and examples of a vinyl monomer having a phosphoric acid group include phosphate mono(2-acryloyloxyethyl ester) and phosphate mono(1-methyl-2-acryloyloxyethyl ester), and the like. Vinyl monomers containing a phenolic hydroxyl group, vinyl monomers containing a sulfonamide group, and the like can also be used as a vinyl monomer having an acidic group.

The block polymer compound in the present invention can be obtained by employing conventional methods. For example, living polymerization, the iniferter method, and the like are known. Besides these, another known method is, when carrying out radical polymerization of a monomer having a pigment adsorbing group or a monomer having no pigment adsorbing group, to perform alkali treatment with an alkali, such as sodium hydroxide or ammonia, to a polymer obtained from polymerization in the presence of a compound containing a thioester and a thiol group within its molecule, such as thiol carboxylic acid, 2-acetylthioethyl ether or 10-acetylthiodecanethiol, forming a polymer which has a thiol group at one end terminal. Further radical polymerization of the monomer component of another block is then carried out in the presence of the obtained polymer which has a thiol group at one end terminal. Among these methods living polymerization is preferred.

Although the weight average molecular weight of the block polymer compound is not particularly limited, a weight average molecular weight within the range of from 3,000 to 100,000 is preferable, and the range of from 5,000 to 50,000 is more preferable. The stabilization effect can be more effectively obtained at a weight average molecular weight of 3,000 or more, and more effective adsorbing and good dispersibility can be demonstrated when the weight average molecular weight is 100,000 or less.

Commercially available products can also be used as the block polymer compound. Specific examples thereof include "DISPERBYK-2000 and 2001" (trade names, made by BYK Chemie), "EFKA 4330, 4340" (trade names, made by EFKA), and the like.

(Graft Polymer Compound)

In the present invention, there are no particular limitations to any graft polymer compound that may be used as desired when preparing the pigment dispersion composition. Preferable examples thereof include: compounds formed from the reaction of polyalkylene imine and polyester compounds, as described in JP-A No. 54-37082, JP-A No. 61-174939, and the like; weight average molecular weight compounds with a polyester modified amino group in the side chain of an allylamine polymer, as described in JP-A No. 9-169821; polyester polyol addition polyurethanes, as described in JP-A No. 60-166318 and the like. Graft polymer compounds which use a polymerizable oligomer (referred to below as a macromonomer) as a copolymerization component, as in JP-A No. 9-171253, and Makuromonomaa no Kagaku to Kogyo [The Chemistry and Technology of Macromonomers] (IPC Publication 1989), are also preferable examples thereof.

Preferable branches of the graft polymer compound include polystyrene, polyethylene oxide, polypropylene oxide, poly(meth)acrylate ester, polycaprolactone, and the like. Among these, the graft polymer compounds having a branch with a structural unit represented by the following Formula (6) are more preferable.

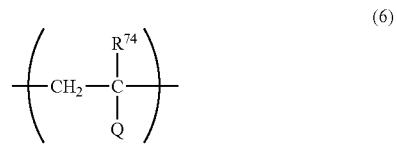

In Formula (6), $R^{74}$ represents a hydrogen atom or an alkyl group of 1 to 8 carbon atoms, and Q represents a cyano group, an aryl group with 6 to 30 carbon atoms, or —$COOR^{75}$ (here, $R^{75}$ represents a hydrogen atom, an alkyl group with 1 to 22 carbon atoms, or an aryl group with 6 to 30 carbon atoms).

In Formula (6), an alkyl group represented with $R^{74}$ may have a substituent, an alkyl group of 1 to 6 carbon atoms is preferable, and a methyl group is particularly preferable. Examples of substituents which can be introduced into such an alkyl group include a halogen atom, a carboxyl group, an alkoxycarbonyl group, an alkoxy group, and the like. Specific examples of such an alkyl group include a methyl group, an ethyl group, a hexyl group, an octyl group, a trifluoromethylgroup, a carboxymethyl group, a methoxycarbonylmethyl group, or the like. A hydrogen atom and a methyl group are particularly preferable for $R^{74}$.

In Formula (6), an aryl group represented with Q may have a substituent, an aryl group of 6 to 20 carbon atoms is preferable, and an aryl group of 6 to 12 carbon atoms is particularly preferable. Examples of substituents which can be introduced into such an aryl group include a halogen atom, an alkyl group, an alkoxy group, an alkoxycarbonyl group, or the like. Specific examples of such an aryl group include a phenyl group, naphthyl group, a tolyl group, a xylyl group, a propylphenyl group, a buthylphenyl group, an octylphenyl group, a dodecylphenyl group, a methoxyphenyl group, an ethoxyphenyl group, a butoxyphenyl group, a decyloxyphenyl group, a chlorophenyl group, a dichlorophenyl group, a bromophenylgroup, a methoxycarbonylphenyl group, an ethoxycarbonylphenyl group, butoxycarbonylphenyl group, or the like. Among such aryl groups, a non-substituted aryl group or an aryl group substituted with a halogen atom, an alkyl group, or an alkoxy group are preferable, and a non-substituted aryl group or an aryl group substituted with an alkyl group are particularly preferable.

When Q of Formula (6) is —$COOR^{75}$, an alkyl group represented with $R^{75}$ may have a substituent, an alkyl group of 1 to 12 carbon atoms is preferable, and an alkyl group of 1 to 8 carbon atoms is particularly preferable. Examples of substituents which can be introduced into such an alkyl group include a halogen atom, an alkenyl group, an aryl group, a hydroxyl group, an alkoxy group, an alkoxycarbonyl group, an amino group, an acylamino group, carbamoyl group, or the like. Specific examples of such an alkyl group include a methyl group, an ethyl group, a propyl group, a butyl group, a heptyl group, a hexyl group, an octyl group, a decyl group, a dodecyl group, a tridecyl group, a tetradecyl group, a hexadecyl group, an octadecyl group, a 2-chloroethyl group, a 2-bromoethyl group, a 2-methoxycarbonylethyl group, a 2-methoxyethyl group, a 2-bromopropyl group, a 2-butenyl group, a 2-pentenyl group, a 3-methyl-2-pentenyl group, a 2-hexenyl group, a 4-methyl-2-hexenyl group, a benzyl group, a phenethyl group, a 3-phenylpropyl group, a naphthylmethyl group, a 2-naphthylethyl group, a chlorobenzyl group, a bromobenzyl group, a methylbenzyl group, an ethylbenzyl group, a methoxybenzyl group, a dimethylbenzyl group, a dimethoxybenzyl group, a cyclohexyl group, a 2-cyclohexylethyl group, a 2-cyclopentylethyl group, a bicyclo [3.2.1]oct-2-yl group, a 1-adamanthyl group, a dimethylaminopropyl group, an acetylaminoethyl group, an N,N-dibutylamino carbamoylmethyl group, or the like. Among such alkyl groups, a non-substituted alkyl group or an alkyl group substituted with a halogen atom, an aryl group, or a hydroxyl group is preferable, and a non-substituted alkyl group is particularly preferable.

When Q of Formula (6) is —COOR$^{75}$, an aryl group represented with R$^{75}$ may have a substituent, an aryl group of 6 to 20 carbon atoms is preferable, and an aryl group of 6 to 12 carbon atoms is particularly preferable. Examples of substituent which can be introduced into such an aryl group include a halogen atom, an alkyl group, an alkenyl group, an alkoxy group, an alkoxycarbonyl group, an acylamino group, or the like. Specific examples of such an aryl group include a phenyl group, a naphthyl group, a tolyl group, a xylyl group, a propylphenyl group, a buthylphenyl group, an octylphenyl group, a dodecylphenyl group, a methoxyphenyl group, an ethoxyphenyl group, a butoxyphenyl group, a decyloxyphenyl group, a chlorophenyl group, a dichlorophenyl group, a bromophenylgroup, a methoxycarbonylphenyl group, an ethoxycarbonylphenyl group, a butoxycarbonylphenyl group, an acetamidophenyl group, a propioamidophenyl group, a dodecyloylamidophenyl group, or the like. Among such aryl groups, a non-substituted aryl group or an aryl group substituted with a halogen atom, an alkyl group, or an alkoxy group is preferable, and an alkyl group substituted aryl group is particularly preferable.

Among such R$^{75}$s, a hydrogen atom and an alkyl group of 1 to 22 carbon atoms are preferable, and a hydrogen atom and an alkyl group of 1 to 12 carbon atoms are particularly preferable.

Specific examples of the branch of a graft polymer compound having a branch of a structural unit represented with such Formula (6) include polymethyl(meth)acrylate, poly-n-butyl(meth)acrylate, poly-i-butyl(meth)acrylate, poly(methyl(meth)acrylate-co-benzyl(meth)acrylate), poly(methyl (meth)acrylate-co-styrene), poly(methyl(meth)acrylate-co-(meth)acrylate), poly(methyl(meth)acrylate-co-acrylonitrile), and the like.

Any known method may be used for the synthesis of the graft polymer compound having a branch of a structural unit represented with Formula (6).

A specific example thereof is copolymerization of a macro-monomer having a structural unit represented with Formula (6) with an ethylenically unsaturated monomer copolymerizable with such a macro-monomer.

Preferable examples of macro-monomers having a structural unit represented with Formula (6) are those represented by the following Formula (7).

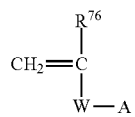

(7)

R$^{76}$ in Formula (7) represents a hydrogen atom or an alkyl group of 1 to 8 carbon atoms. W of Formula (7) represents a single bond, a linking group shown below, or a linking group configured with a given combination of the divalent groups shown below. A of Formula (7) represents a group which has a structural unit represented by Formula (6).

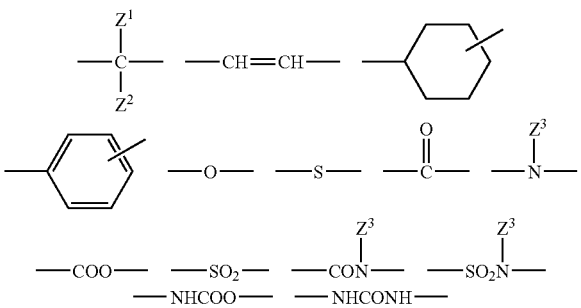

In the above linking groups, $Z^1$ and $Z^2$ each independently represent, a hydrogen atom, a halogen atom, an alkyl group of 1 to 6 carbon atoms, a cyano group, or a hydroxyl group, and $Z^3$ represents a hydrogen atom, an alkyl group of 1 to 18 carbon atoms, or an aryl group of 6 to 20 carbon atoms.

Specific examples of macro-monomers represented by the Formula (7) are shown below.

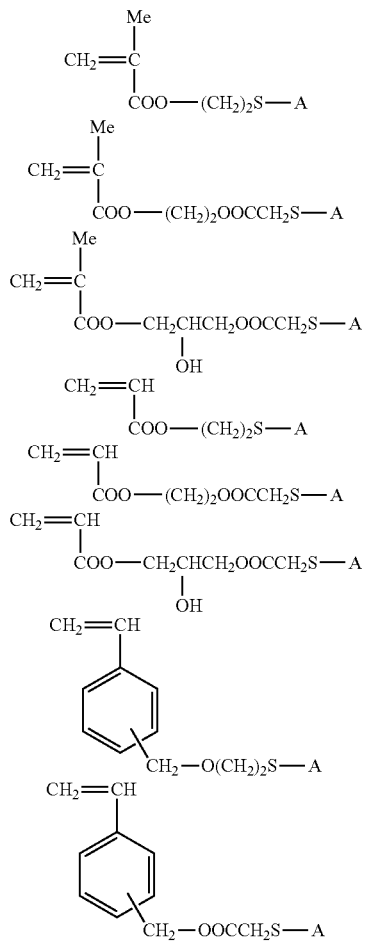

In the above structures of specific examples of the macro-monomer, A has the same meaning as A in Formula (7).

Commercially available examples of such macro-monomers include a polymethylmethacrylate oligomer methacryloylated at one end terminal (Mn=6,000, trade name:AA-6, made by Toagosei Chemical Industry Co., Ltd.), a poly-n-butyl acrylate oligomer methacryloylated at one end terminal (Mn=6,000, trade name:AB-6, made by Toagosei Chemical Industry Co., Ltd.), and a polystyrene oligomer methacryloylated at one end terminal (Mn=6,000, trade name:AS-6, made by Toagosei Chemical Industry Co., Ltd.).

The above macro-monomer preferably has a molecular weight of number average molecular weight (Mn) 1,000 to 20,000 using the polystyrene standard, and the molecular weight thereof is more preferably 2,000 to 15,000. When the number average molecular weight is in the above range a more effective steric repulsion effect as a pigment dispersant can be obtained.

The "monomers which configure a pigment adsorbing block" described above are preferably used for the ethylenically unsaturated monomer copolymerizable with the macro-monomer, in order to raise the dispersibility of the pigment, and the dispersion stability thereof. The "monomers which configure a non-pigment adsorbing block" described above may be used as the other copolymerization components for copolymerization.

The weight average molecular weight of the above graft polymer compound is not particularly limited, however, a molecular weight within the range of from 3,000 to 100,000 is preferable, and within the range of from 5,000 to 50,000 is more preferable. When the weight average molecular weight is 3,000 or more, the stabilization effect can be more effectively obtained, and when the weight average molecular weight is 100,000 or less there is more effective adsorbing and good dispersibility can be exhibited.

Commercial compounds which can be used for the graft polymer compound include "SOLSPERSE 24000, 28000, 32000, 38500, 39000, and 55000" (trade names, made by Lubrizol Corporation) and "DISPERBYK-161, 171, and 174" (trade names, made by BYK Chemie).

(Terminal Modified Polymer Compounds)

Examples of terminal modified polymer compounds used as the polymer dispersant include polymer compounds having a functional group at the terminal of the polymer, as described in JP-A No. 9-77994, JP-A No. 2002-273191 and the like.

There are no particular limitations to the method used for synthesis of a polymer compound having a functional group at the terminal of the polymer, however, examples thereof include the following methods.

1. A synthesis method of polymerization using an initiator for the functional group contained (for example, radical polymerization, anionic polymerization, cationic polymerization, and the like).
2. A synthesis method of radical polymerization using a chain transfer agent for the functional group contained.

Examples of the functional group introduced here include an adsorbing site represented with $B^1$ in Formula (4) described in the specification of Japanese Patent Application Laid-Open No. 2008-096678 (namely, a site selected from an organic dye structure, a heterocyclic structure, an acidic group, a group having a basic nitrogen atom, a urea group, a urethane group, the group that has an oxygen ligand, a hydrocarbon group with 4 or more carbon atoms, an alkoxy silyl group, an epoxy group, an isocyanate group, a hydroxyl group, and an ionic functional group). Functional groups from which such adsorption sites can be derived may also be used.

Examples of the polymerization initiator (polymerization initiator of the functional group contained) used in synthesizing method 1 to introduce a functional group at the polymer terminus include 2,2'-azobis (2-cyanopropanol), 2,2'-azobis (2-cyanopentanol), 4,4'-azobis (4-cyanovaleric acid), 4,4'-azobis(4-cyanovaleric acid chloride), 2,2'-azobis[2-(5-methyl-2imidazoline-2-yl)propane], 2,2'-azobis [2-(2-imidazoline-2-yl)propane], 2,2'-azobis[2-(3,4,5,6-tetrahydropyrimidine-2-yl) propane], 2,2'-azobis {2-[1-(2-hydroxyethyl)-2-imidazoline 2-yl]propane}, 2,2'-azobis [2-methyl-N-(2-hydroxyethyl)-propionamide], and the like, and derivatives thereof.

Examples of the chain transfer agent (chain transfer agent of the functional group contained) used with the synthesizing method 2 to introduce a functional group at the polymer terminus include mercapto compounds (such as, for example, thioglycolic acid, thiomalic acid, thiosalicylic acid, 2-mercaptopropionic acid, 3-mercaptopropionic acid, 3-mercaptobutyric acid, N-(2-mercaptopropyonyl) glycine, 2-mercaptonicotinic acid, 3-[N-(2-mercaptoethyl)carbamoyl] propionic acid, 3-[N-(2-mercaptoethyl) amino]propionic acid, N-(3-mercaptopropionyl)alanine, 2-mercaptoethanesulfonic acid, 3-mercaptopropanesulfonic acid, 4-mercaptobutanesulfonic acid, 2-mercaptoethanol, 3-mercapto-1,2-propanediol, 1-mercapto-2-propanol, 3-mercapto-2-butanol, mercaptophenol, 2-mercaptoethylamine, 2-mercaptoimidazole, 2-mercapto-3-pyridinol, benzenethiol, toluenethiol, mercaptoacetophenone, naphthalenthiol, and naphthalenemethanethiol), disulfide compounds which are the oxidized compounds of the foregoing mercapto compounds, and halogenated compounds (such as, for example, 2-iodoethanesulfonic acid, and 3-iodopropanesulfonic acid).

The "monomer which configures a non-pigment adsorbing block" described above can be used, for example, as a radical polymerizable monomer for the monomer used for polymerization of the polymer compound having a functional group at the terminal of the polymer.

The molecular weight of the terminal modified polymer compound is preferably a weight average molecular weight of 1,000 to 50,000. The steric repulsion effect as a pigment dispersant can be more effectively obtained when the number average molecular weight is 1,000 or more, and when the member average molecular weight 50,000 or less the steric effect is more effectively suppressed and the duration of adhesion to a pigment can be shortened further.

Examples of commercial terminal modified polymer compounds which can be used include "SOLSPERSE 3000, 17000, and 27000" (trade names, made by Lubrizol Corporation).

A graft polymer compound and a terminal modified polymer compound are preferable as a pigment dispersant in the present invention, and among these, particularly preferable examples include, a graft polymer compound containing a copolymerization unit derived from a monomer having an organic dye structure or a heterocyclic structure, and a terminal modified polymer compound with an organic dye structure, a heterocyclic structure, an acidic group, a basic nitrogen atom containing group, a urea group, or a urethane group as the terminal group. In the present invention, the specific graft polymer compounds described above may be further added to the pigment dispersion composition as a pigment dispersant, and may also be used as a general dispersant.

The amount of polymer dispersant added as a pigment dispersant is preferably so as to become 0.5 mass % to 100 mass % with respect to the pigment, 3 mass % to 100 mass % is more preferable, and 5 mass % to 80 mass % is particularly preferable. When the amount of pigment dispersant is within these ranges, sufficient pigment dispersion effect can be obtained. However, the optimal amount of addition of the dispersant is suitably adjusted according to the combination used of the pigment, the kind of solvent and the like. When preparing the pigment dispersion composition, dispersants besides the above polymer dispersant, such as a surfactant, can also be used.

[Preparation of the Pigment Dispersion Composition]

The pigment dispersion composition can be prepared by a mixing and dispersion process that performs mixing and dispersing using various kinds of mixing machines and dispersion machines. It should be noted that although in such a mixing and dispersion process it is preferable to carry out mixing and kneading dispersion and then micro-dispersion treatment, the mixing and kneading dispersion may be omitted.

Specifically the pigment dispersion composition can be prepared by, for example, mixing the pigment, and as required the polymer dispersant, in advance with a homogenizer or the like, then carrying out micro-dispersion to the dispersion prepared in advance using a bead dispersion machine (for example, a DISPERMAT, trade name, made from GETZMANN) with zirconia beads or the like. The dispersion time is preferably about 3 to 6 hours. For the micro-dispersion treatment with beads, in the main a vertical sand grinder, a horizontal sand grinder, a pin mill, a slit mill, an ultrasonic dispersion machine and the like can be used, with a beads of particle size of 0.01 mm to 1 mm made from glass, zirconia, and the like. Details regarding mixing, kneading and dispersion are described in "Paint Flow and Pigment Dispersion", by T. C. Patton (published by John Wiley and Sons Co. 1964) and the like.

The dispersibility and dispersion stability of the pigment is excellent due to including in the pigment dispersion composition the fine pigment obtained by salt milling in the presence of the specific sodium chloride described previously. By preparing such a pigment dispersion composition in advance, the dispersion state of the pigment can be made good, resulting in a composition with excellent transmissivity, namely excellent color strength. Such a colored curable composition is, therefore, preferably used for production of color filters in which good color characteristics are demanded.

<Colored Curable Composition>

The colored curable composition of the present invention includes: the above described pigment dispersion composition including the pigment (A) made into fine particles in the presence of sodium chloride (NaCl), the solvent (E), and as required the polymer dispersant (F); the alkali soluble resin (B), the polymerizable compound (C) and the photopolymerization initiator (D). Other components may be included as required, such as a surfactant.

Explanation will now be given of details of each component configuring the colored curable composition of the present invention.

[Pigment Dispersion Composition]

The amount contained of the pigment dispersion composition in the colored curable composition of the present invention is preferably an amount such that the amount contained of the pigment (A) is in the range of 40 mass % to 70 mass % with respect to the total solids (mass) of the colored curable composition, and an amount such that the amount contained of the pigment is in the range of 45 mass % to 60 mass % is more preferable.

The amount contained of the pigment dispersion composition within these ranges is effective for securing sufficient color density and excellent color characteristics.

[Alkali Soluble Resin (B)]

The colored curable composition of the present invention includes an alkali soluble resin. The alkali soluble resin is a linear organic polymer, and may be suitably selected from an alkali soluble resin having at least one group within the molecule (preferably a molecule with an acrylic copolymer or a styrene copolymer as a main chain) promoting alkali solubility (such as, for example, a carboxyl group, a phosphoric acid group, or a sulfonic acid group).

Among these, resins which are soluble in an organic solvent and developable by a weak alkali aqueous solution are still more preferable.

A known radical polymerization method is, for example, applicable for production of the alkali soluble resin. Polymerization conditions during manufacturing the alkali soluble resin with a radical polymerization method, such as the temperature, pressure, type of radical initiator and amount thereof, type of solvent, and the like are easily determined by a person skilled in the art, and the conditions can be derived experimentally.

The linear organic polymer preferably is a polymer having a carboxylic acid group in a side chain thereof. Preferable examples include, for example, a methacrylic acid copolymer, an acrylic acid copolymer, an itaconic acid copolymer, a crotonic acid copolymer, a maleic acid copolymer, a partially esterified maleic acid copolymer, or the like as described in JP-A No. 59-44615, JP-B No. 54-34327, JP-B No. 58-12577, JP-B No. 54-25957, JP-A No. 59-53836, and JP-A No. 59-71048, an acidic cellulose derivative having carboxylic acid in a side chain, and a polymer having a hydroxyl group to which an acid anhydride has been added, and a polymer which has an (meth)acryloyl group in a side chain.

Among these, a benzyl(meth)acrylate/(meth)acrylic acid copolymer, and a multi-component copolymer configured from benzyl(meth)acrylate/(meth)acrylic acid/another monomer are preferred.

Besides these, products produced by copolymerization with 2-hydroxyethyl methacrylate are also effective.

Besides the above, other examples include a 2-hydroxypropyl(meta)acrylate/polystyrene macro-monomer/benzyl methacrylate/ methacrylic acid copolymer, and a 2-hydroxy-3-phenoxypropylacrylate/polymethylmethacrylate macro-monomer/benzyl methacrylate/methacrylic acid copolymer, a 2-hydroxyethyl methacrylate/polystyrene macro-monomer/methyl methacrylate/methacrylic acid copolymer, and a 2-hydroxyethyl methacrylate/polystyrene macro-monomer/benzyl methacrylate/methacrylic acid copolymer, as described in JP-A No. 7-140654, and the like.

Particularly suitable for the alkali soluble resin in the present invention are copolymers of (meth)acrylic acid with other monomers copolymerizable therewith. Here, (meth) acrylic acid is used as a general term to mean acrylic acid and/or methacrylic acid, and (meth)acrylate is used in a similar manner as a general term for acrylate and/or methacrylate.

Examples of other monomers copolymerizable with (meth)acrylic acid include alkyl(meth)acrylates, aryl(meth) acrylates, vinyl compounds, and the like. Here, the hydrogen atom(s) of the alkyl group and the aryl group may be substituted by a substituent. Specific examples of the alkyl(meth) acrylates and aryl(meth)acrylates include methyl(meth)acrylate, ethyl(meth)acrylate, propyl(meth)acrylate, butyl(meth) acrylate, isobutyl (meth)acrylate, pentyl(meth)acrylate, hexyl(meth)acrylate, octyl(meth)acrylate, phenyl(meth) acrylate, benzyl(meth)acrylate, tolyl(meth)acrylate, naphthyl(meth)acrylate, and cyclohexyl(meth)acrylate.

Examples of the vinyl compounds include, for example, styrene, α-methylstyrene, vinyltoluene, glycidyl methacrylate, acrylonitrile, vinyl acetate, N-vinyl pyrrolidone, tetrahydrofurfuryl methacrylate, a polystyrene macro-monomer, a polymethylmethacrylate macro-monomer, $CH_2=CR^7R^8$, $CH_2=C(R^7)(COOR^9)$ (wherein $R^7$ represents a hydrogen atom or an alkyl group of 1 to 5 carbon atoms, $R^8$ represents an aromatic hydrocarbon ring of 6 to 10 carbon atoms, and $R^9$ represents an alkyl group of 1 to 8 carbon atoms, or an aralkyl group of 6 to 12 carbon atoms.

These other copolymerizable monomers may be used singly or in combinations of two or more thereof.

Preferable other copolymerizable monomers include at least one monomer selected from $CH_2=CR^7R^8$, $CH_2=C(R^7)(COOR^9)$, phenyl(meth)acrylate, benzyl(meth)acrylate, and/or styrene, and particularly preferable is $CH_2=CR^7R^8$ and/or $CH_2=C(R^7)(COOR^9)$.

The amount contained of alkali soluble resin in the colored curable composition, is preferably 1 to 15 mass % with respect to the total solids of the composition, is more preferably 2 to 12 mass %, and is particularly preferably 3 to 10 mass

[Polymerizable Compound (C)]

The polymerizable compound which configures the colored curable composition of the present invention has at least one ethylenically unsaturated group at which addition polymerization is possible, a compound with a boiling temperature at normal pressure of 100° C. or above is preferable therefore, and an acrylate compound with four or more functions is more preferable.

Examples of compounds having an at least one ethylenically unsaturated group at which addition polymerization is possible and having a boiling temperature at normal pressure of 100° C. or above include: monofunctional acrylates and methacrylates, such as polyethylene glycol mono-(meth)acrylate, polypropylene glycol mono-(meth)acrylate, and phenoxyethyl(meth) acrylate; and polyfunctional acrylates and methacrylates, such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexandiol(meth)acrylate, trimethylolpropane tri(acryloyloxypropyl) ether, tri(acryloyloxyethyl) isocyanurate, compounds obtained by (meth)acrylation after adding ethylene oxide or propylene oxide to a polyfunctional alcohol, such as glycerin, and trimethylolethane, compounds obtained by poly(meth)acrylation of pentaerythritol or dipentaerythritol described in JP-B No. 48-41708, JP-B No. 50-6034, and JP-A No. 51-37193, and the polyester acrylates, epoxy acrylates that are the resultant products of reacting an epoxy resin and (meth)acrylic acid described in JP-A No. 48-64183, JP-B No. 49-43191, JP-B No. 52-30490. The photo-curable monomers and oligomers introduced in Nippon Secchaku Kyokai Shi [Journal of the Adhesion Society of Japan] Vol. 20, No.7 pages 300-308 can also be used.

The specific examples of Formula (1) and (2) in JP-A No. 10-62986A, and the described compounds therein obtained by (meth)acrylation after adding ethyleneoxide and propylene oxide in a polyfunctional alcohol, can also be used.

Preferable compounds also include urethane acrylates, such as those described in JP-B No. 48-41708, JP-A No. 51-37193, JP-A No. 2-32293, JP-A No. 2-16765, and urethane compounds which have an ethyleneoxide skeleton, as described in JP-B No. 58-49860, JP-B No. 56-17654, JP-B No. 62-39417, and JP-B No. 62-39418. Furthermore, polymerizable compositions with extremely excellent sensitization speed, depending on use, may be obtained by using the addition polymerizable compounds having an amino structure and a sulfide structure within their molecules, as described in JP-A No. 63-277653, JP-A No. 63-260909, and JP-A No. 1-105238. Examples of commercial products thereof include urethane oligomers UAS-10, UAB-140 (trade names, made by Sanyo-Kokusaku Pulp Co., Ltd.), UA-7200 (trade name, made by Shin Nakamura Kagaku Co., Ltd.), DPHA-40H (trade names, made by Nippon Kayaku Co., Ltd.), UA-306H, UA-306T, UA-306I, AH-600, T-600, AI-600 (trade names, made by Kyoeisha Co., Ltd.), and the like.

Ethylenically unsaturated compounds having an acidic group are also preferred, with commercial products thereof including TO-756, which is a carboxyl group containing 3-functional acrylate, and TO-1382, which is a carboxyl group containing 5-functional acrylate (trade names, made by Toagosei, Inc.), and the like.

Among these, dipentaerythritol penta(meth)acrylate, dipentaerythritol hexa(meth)acrylate, and compounds thereof structured with the acryloyl groups through ethylene glycol or a propylene glycol residue, are preferable. Oligomers thereof can also be used.

As well as using the polymerizable compound (C) in the present invention singly, combinations of two or more thereof may also be used.

The amount contained of the polymerizable compound in the colored curable composition is preferably 20 to 200 parts by mass with respect to total-solids of 100 parts by mass of the colored curable composition, and 50 to 120 parts by mass thereof is more preferable. When the amount contained of the polymerizable compound is this within this range then sufficient curing reaction can carried out.

[Photopolymerization Initiator (D)]

Examples of the photopolymerization initiator include, for example: a halomethyl oxadiazole, as described in JP-A No. 57-6096; activitated halogenated compounds, such as halomethyl-s-triazine described in JP-B No. 59-1281, JP-A No. 53-133428, and the like;

aromatic carbonyl compounds, such as ketal, acetal or benzoin alkyl ethers, as described in the specifications of U.S. Pat. No. 4,318,791 and European Patent Application Laid-Open No. EP-88050 and the like; aromatic ketone compounds, such as the benzophenone described in the specification of U.S. Pat. No. 4,199,420; (thio)xanthone compounds and acridine compounds, as described in the specification of Fr-2456741; coumarin compounds and biimidazole compounds, as described in JP-A No. 10-62986; and organosulfonium boron complexes, such as those described in JP-A No. 8-015521; and the like.

Preferred examples of the photopolymerization initiator include acetophenone-, ketal-, benzophenone-, benzoin-, benzoyl-, xanthone-, activated halogenated compound-(triazine-, halomethyl oxadiazole-, coumarin-), acridines-, biimidazole-, and oxime ester-initiators.

Preferred examples of acetophenone -photopolymerization initiators include 2,2-diethoxyacetophenone, p-dimethylamino acetophenone, 2-hydroxy-2-methyl-1-phenyl-propan-1-one, p-dimethylamino acetophenone, 4'-isopropyl-2-hydroxy-2-methyl-propiophenone, 1-hydroxy-cyclohexyl phenyl ketone, 2-benzyl-2-dimethylamino-1-(4-morpholinophenyl)-butanone-1,2-tolyl-2-dimethylamino-1-(4-morpholinophenyl)-butanone-1, and 2-methyl-1-[4-(methylthio)phenyl]-2-morpholino-propanone-1.

Preferred examples of ketal-photopolymerization initiators include benzyl dimethyl ketal, benzyl-β-methoxy ethyl acetal, and the like.

Preferred examples of benzophenone-photopolymerization initiators include benzophenone, 4,4',-(bisdimethylamino) benzophenone, 4,4'-(bisdiethylamino)benzophenone, and 4,4'-dichloro benzophenone.

Preferred examples of benzoin- or benzoyl-photopolymerization initiators include benzoin isopropyl ether, benzoin isobutyl ether, benzoin methyl ether, methyl-o-benzoylbenzoate, and the like.

Preferred examples of xanthone-photopolymerization initiators include diethylthioxanthone, diisopropylthioxantone, mono isopropyl thioxantone, chlorothioxantone, and the like.

Preferred examples of activated halogen photopolymerization initiators (triazine-, oxadiazole-, coumarin-initiators) include 2,4-bis(trichloromethyl)-6-p-methoxyphenyl-s-triazine, 2,4-bis(trichloromethyl)-6-p-methoxy styryl-s-triazine, 2,4-bis(trichloromethyl)-6-(1-p-dimethylaminophenyl)-1,3-butadienyl-s-triazine, 2,4-bis(trichloromethyl)-6-biphenyl-s-triazine, 2,4-bis(trichloromethyl)-6-(p-methylbiphenyl)-s-triazine, p-hydroxyethoxystyryl-2,6-di(trichloromethyl)-s-triazine, methoxystyryl 2,6-di(trichloromethyl)-s-triazine, 3,4-dimethoxystyryl-2,6-di(trichloromethyl)-s-triazine, 4-benzoxolane-2,6-di(trichloromethyl)-s-triazine, 4-(o-bromo-p-N,N-(diethoxy carbonylamino)-phenyl)-2,6-di(chloromethyl)-s-triazine, 4-(p-N,N-(diethoxycarbonylamino)-phenyl)-2,6-di(chloromethyl)-s-triazine, 2-trichloromethyl-5-styryl-1,3,4-oxadiazole, 2-trichloromethyl-5-(cyanostyryl)-1,3,4-oxadiazole, 2-trichloromethyl-5-(naphth-1-yl)-1,3,4-oxadiazole, 2-trichloromethyl-5-(4-styryl) styryl-1,3,4-oxadiazole, 3-methyl-5-amino-((s-triazine-2-yl) amino)-3-phenylcoumarin, 3-chloro-5-diethylamino-((s-triazine-2-yl) amino)-3-phenylcoumarin, 3-butyl-5-dimethylamino-((s-triazine-2-yl) amino)-3-phenylcoumarin, and the like.

Preferred examples acridine-photopolymerization initiators include 9-phenylacridine, 1,7-bis(9-acridinyl)heptane, and the like.

Preferred examples of biimidazole-photopolymerization initiators include 2-(o-chlorophenyl)-4,5-diphenyl imidazolyl dimer, 2-(o-methoxyphenyl)-4,5-diphenyl imidazolyl dimer, 2-(2,4-dimethoxyphenyl)-4,5-diphenyl imidazolyl dimer, and the like.

Other examples thereof in addition to the above, include 1-phenyl-1,2-propanedione-2-(o-ethoxycarbonyl) oxime, O-benzoyl-4'-(benzmercapto) benzoyl-hexyl-ketoxime, 2,4,6-trimethyl phenylcarbonlyl diphenylphosphonyl oxide, salts of hexafluoro-phosphoro-trialkylphenylphosphonium, and the like.

In the present invention, there is no limitation to the above photopolymerization initiators, and other known initiators can be used. Examples thereof include: vicinal polyketolaldonyl compounds, as described in the specification of U.S. Pat. No. 2,367,660; α-carbonyl compounds, as described in the specification of U.S. Pat. Nos. 2,367,661 and 2,367,670; acyloin ethers, as described in the specification of U.S. Pat. No. 2,448,828; aromatic acyloin compounds substituted with an α-hydrocarbon, as described in the specification of U.S. Pat. No. 2,722,512; polynuclear quinone compounds, as described in the specification of U.S. Pat. Nos. 3,046,127 and 2,951,758; combinations of triarylimidazole dimer/p-aminophenyl ketone, as described in the specification of U.S. Pat. No. 3,549,367; benzothiazole compound/trihalomethyl-s-triazine compound, as described in JP-B No. 51-48516; oxime ester compounds, as described in J. C. S. Perkin II (1979) 1653-1660, J. C. S. Perkin II (1979) 156-162, Journal of Photopolymer Science and Technology (1995) 202-232, and in JP-A No. 2000-66385; and the like. These photopolymerization initiators can also be used in combinations thereof.

The amount contained of photopolymerization initiator in the photo-curable composition is preferably 0.1 mass % to 10.0 mass %, and is more preferably 0.5 mass % to 5.0 mass %, with respect to the total solids of the composition. When the amount contained of photopolymerization initiator is within these ranges then there is good polymerization reaction promotion and film formation with good strength is possible.

—Sensitizing Dye—

In the present invention, a sensitizing dye is preferably added as required. The radical generating reaction of the polymerization initiator component is promoted by light-exposure of the wavelengths absorbed by the sensitizing dye, and the polymerization reaction of the polymerizable compound is promoted thereby. Examples of such a sensitizing dye include known spectral sensitizing dyes or colorants, or dyes or colorants that absorb light and interact with the photopolymerization initiator.

(Spectral Sensitizing Dye or Dye)

Examples of preferable spectral sensitizing dyes or colorants used for the sensitization dye for the present invention include: polynuclear aromatics (for example, pyrene, perylene, triphenylene); xanthenes (for example, fluorescein, eosin, erythrosin, rhodamine B, rose bengal; cyanines (for example, thiacarbocyanine, oxacarbocyanine); merocyanines (for example, merocyanine, carbomerocyanine); thiazines (for example, thionine, methylene blue and toluidine blue); acridines (for example, acridine orange, chloroflavin, acriflavine); phthalocyanines (for example, phthalocyanine, metal phthalocyanines); porphyrins (for example, tetraphenylporphyrin, central metal-substituted porphyrins); chlorophylls (for example, chlorophyll, chlorophyllin, central metal-substituted chlorophyll); metal complexes (for example, the following compounds); anthraquinones (for example, anthraquinone); squaryliums (for example, squarylium); and the like.

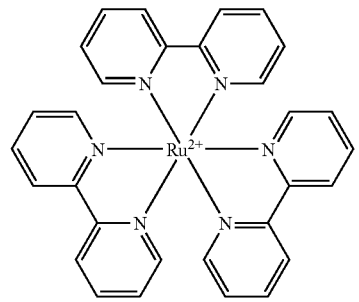

More preferable examples of the spectral sensitizing dyes include styryl-based dyes described in JP-B No. 37-13034, cation dyes described in JP-A No. 62-143044, quinoxalinium salts described in JP-B No. 59-24147, novel methylene blue compounds described in JP-A No. 64-33104, anthraquinones described in JP-A No. 64-56767, benzoxanthene dyes described in JP-A No. 2-1714, acridines described in JP-A No. 2-226148 and JP-A No. 2-226149, pyrylium salts described in JP-B No. 40-28499, cyanines described in JP-B No. 46-42363, benzofuran dyes described in JP-A No. 2-63053, conjugate ketone dyes described in JP-A No. 2-85858 and JP-A No. 2-216154, dyes described in JP-A No. 57-10605, azocinmamylidene derivatives described in JP-B No. 2-30321, cyanine-based dyes described in JP-A No. 1-287105, xanthene-based dyes described in JP-A No. 62-31844, JP-A No. 62-31848, and JP-A No. 62-143043, aminostyryl ketones described in JP-B No. 59-28325, dyes described in JP-A No. 2-179643, melocyanine dyes described in JP-A No. 2-244050, merocyanine dyes described in JP-B No. 59-28326, merocyanine dyes described in JP-A No. 59-89303, merocyanine dyes described in JP-A No. 8-129257, and benzopyran-based dyes described in JP-A No. 8-334897.

(Dyes having Absorption Maximum Wavelength at 350 nm to 450 nm)

Examples of other preferable embodiments of sensitizing dyes include compounds belonging to the following groups of dyes having an absorption maximum wavelength at 350 nm to 450 nm. Examples include: polynuclear aromatics (for example, pyrene, perylene and triphenylene); xanthenes (for example, fluorescein, eosin, erythrosine, rhodamine B, and rose bengal); cyanines (for example, thiacarbocyanine and oxacarbocyanine); merocyanines (for example, merocyanine and carbomerocyanine); thiazines (for example, thionine, methylene blue and toluidine blue); acridines (for example, acridine orange, chloroflavin, acriflavine); anthraquinones (for example, anthraquinone); and squaryliums (for example, squarylium).

More preferable examples of sensitizing dyes include the compounds represented by the following Formulae (XIV) to (XVIII).

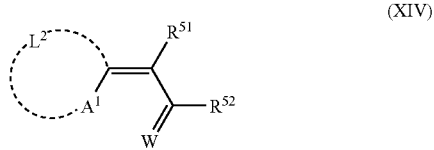

(XIV)

In Formula (XIV), $A^1$ represents a sulfur atom or $NR^{50}$, $R^{50}$ represents an alkyl group or an aryl group, $L^2$ represents a nonmetallic atom group which forms the basic nucleus of a dye in combination with adjoining $A^1$ and the adjacent carbon atom, $R^{51}$ and $R^{52}$ each independently represent a hydrogen atom or a monovalent group of nonmetallic atoms, and $R^{51}$ and $R^{52}$ may be joined together and form an acidic nucleus of a dye. W represents an oxygen atom or a sulfur atom.

Specific preferable examples of compounds represented by Formula (XIV) are shown in [(F-1) to (F-5)] below.

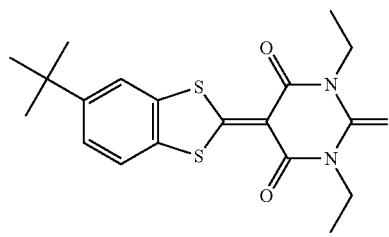

(F-1)

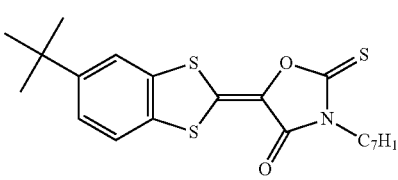

(F-2)

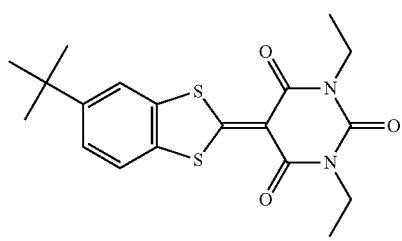

(F-3)

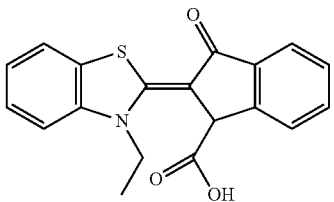

(F-4)

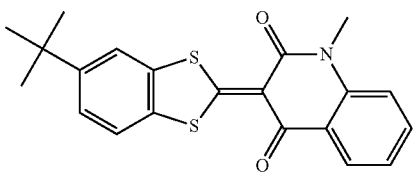

(F-5)

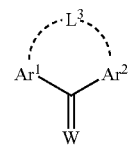

(XV)

(In Formula (XV), $Ar^1$ and $Ar^2$ each independently represents an aryl group, and $Ar^1$ and $Ar^2$ are connected together by -L3-. $L^3$ represents —O— or —S—. W has the same meaning as indicated for W in Formula (XIV).

Preferable examples of compounds represented by Formula (XV) are shown in [(F-6) to (F-8)] below.

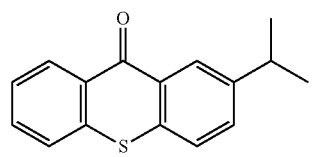

(F-6)

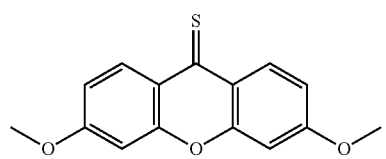

(F-7)

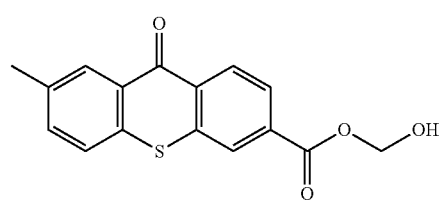

(F-8)

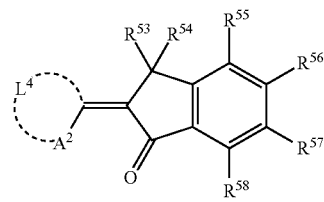

(XVI)

(In Formula (XVI), $A^2$ represents a sulfur atom or $NR^{59}$, $L^4$ represents a nonmetallic atom group which forms a basic nucleus of a dye in combination with adjoining $A^2$ and the adjacent carbon atom, $R^{53}$, $R^{54}$, $R^{55}$, $R^{56}$, $R^{57}$, and $R^{58}$ each independently represents a monovalent group of nonmetallic atoms, and $R^{59}$ represents an alkyl group or an aryl group. Preferable examples of compounds represented with Formula (XVI) are shown in [(F-9) to (F-11)] below.

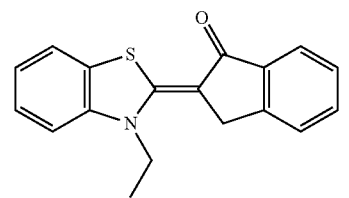

(F-9)

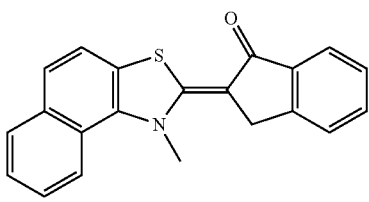

(F-10)

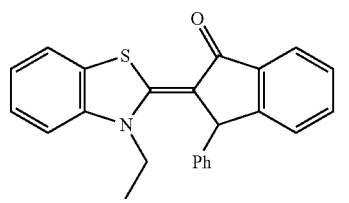

(F-11)

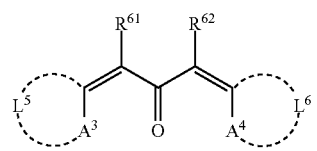

(XVII)

(In Formula (XVII), $A^3$ and $A^4$ each independently represents —S— or —NR$^{63}$, R$^{63}$ represents a substituted or unsubstituted alkyl group or a substituted or unsubstituted aryl group, $L^5$ and $L^6$ each independently represents a nonmetallic atom group and forms a basic nucleus of a dye in combination with the respective adjoining $A^3$, $A^4$ and adjacent carbon atom, $R^{61}$ and $R^{62}$ are each independently a monovalent group of nonmetallic atoms, or $R^{61}$ and $R^{62}$ are joined together to form an aliphatic or aromatic ring).

Preferable examples of compounds represented by Formula (XVII) are shown in [(F-12) to (F-15)] below.

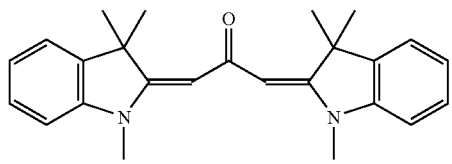

(F-12)

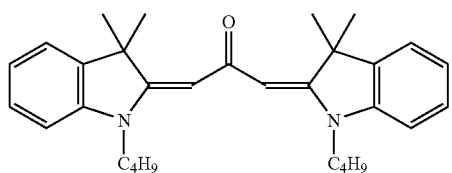

(F-13)

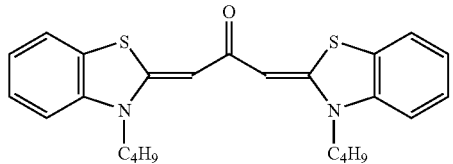

(F-14)

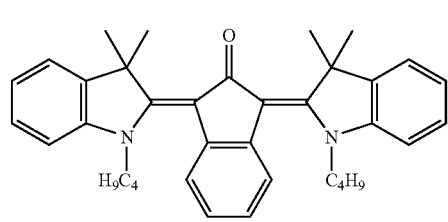

(F-15)

Compounds according to the following formula (XVIII) are also preferable examples of the sensitizing dye used for the present invention.

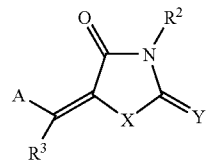

(XVIII)

In the formula (XVIII), A represents an optionally substituted aromatic ring or heterocycle, X represents an oxygen atom, a sulfur atom, or —N(R$^1$)—, and Y represents an oxygen atom or —N(R$^1$)—. R$^1$, R$^2$, and R$^3$ each independently represents a hydrogen atom or a monovalent group of nonmetal atoms. A, R$^1$, R$^2$, and R$^3$ may be combined with each other to form an aliphatic or aromatic ring.

When R$^1$, R$^2$, and R$^3$ each represents a monovalent group of nonmetal atoms, and preferably represents a substituted or unsubstituted alkyl group or aryl group. Specific preferable examples of R$^1$, R$^2$, and R$^3$ are described below. Preferable examples of the alkyl group include linear, branched, and cyclic alkyl groups having 1 to 20 carbon atoms, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecy group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Among them, linear alkyl groups having 1 to 12 carbon atoms, branched alkyl groups having 3 to 12 carbon atoms, and cyclic alkyl groups having 5 to 10 carbon atoms are more preferable.

As the substituent of the substituted alkyl group, a monovalent group of non-metal atoms excluding hydrogen atoms is used, preferable examples thereof include a halogen atom (—F, —Br, —Cl, or —I), a hydroxyl group, an alkoxy group, an aryloxy group, a mercapto group, an alkylthio group, an arylthio group, an alkyldithio group, an aryldithio group, an amino group, a N-alkylamino group, a N,N-dialkylamino group, a N-aryl amino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkylsulfoxy group, an arylsulfoxy group, an acyloxy group, an acylthio group, an acylamino group, a N-alkylacylamino group, a N-arylacylamino group, an ureido group, a N'-alkylureido group, a N',N'-dialkylureido group, a N'-arylureido group, a N',N'-diarylureido group, a N'-alkyl-N'-arylureido group, a N-alkylureido group, a N-arylureido group, a N'-alkyl-N-alkylureido group, a N'-alkyl-N-arylureido group, a N',N'-dialkyl-N-alkylureido group, a N',N'-dialkyl-N-arylureido group, a N'-aryl-N-alkylureido group, a N'-aryl-N-arylureido group, a N',N'-diaryl-N-alkylureido group, a N',N'-diaryl-N-arylureido group, a N'-alkyl-N'-aryl-N-alkylureido group, a N'-alkyl-N'-aryl-N-arylureido group, an alkoxycarbonylamino group, an aryloxycarbonylamino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N,N-dialkylcarbamoyl group, a N-alkyl-N-arylcarbamoyl group, an alkylsulfinyl group, an arylsulfinyl group, an alkylsulfonyl group, an arylsulfonyl group, a sulfo group (—$SO_3H$) and conjugate base groups thereof (hereinafter, referred to as a sulfonate group), an alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a phosphono group (—$PO_3H_2$) and conjugate base groups thereof (hereinafter, referred to as a phosphonate group), a dialkylphosphono group (—$PO_3(alkyl)_2$), diarylphosphono group (—$PO_3(aryl)_2$), an alkylarylphosphono group (—$PO_3(alkyl)(aryl)$), a monoalkylphosphono group (—$PO_3H(alkyl)$) and conjugate base groups thereof (hereinafter, referred to as an alkylphosphonate group), a monoarylphosphono group (—$PO_3H(aryl)$) and conjugate base groups thereof (hereinafter, referred to as an arylphosphonate group), phosphonooxy group (—$OPO_3H_2$) and conjugate base groups thereof (hereinafter, referred to as a phosphonateoxy group), a dialkyl phosphonooxy group (—$OPO_3(alkyl)_2$), diarylphosphonooxy group (—$OPO_3(aryl)_2$), alkylarylphosphonooxy group (—$OPO_3(alkyl)(aryl)$), monoalkylphosphonooxy group (—$OPO_3H(alkyl)$) and conjugate base groups thereof (hereinafter, referred to as an alkylphosphonateoxy group), monoarylphosphonooxy group (—$OPO_3H(aryl)$) and conjugate base groups thereof (hereinafter, referred to as an arylphosphonateoxy group), a cyano group, a nitro group, an aryl group, a heteroaryl group, an alkenyl group, an alkynyl group, and a silyl group.

Specific examples of the alkyl group in these substituents include the above-described alkyl groups, which may be further substituted.

Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, a N-phenylcarbamoylphenyl group, a cyanophenyl group, a sulfophenyl group, a sulfonatephenyl group, a phosphonophenyl group, and a phosphonatephenyl group.

The heteroaryl group is a group derived from a monocyclic or polycyclic aromatic ring containing at least one of a nitrogen atom, an oxygen atom, and a sulfur atom. Particularly preferable examples of the heteroaryl ring in the heteroaryl group include thiophene, thiathrene, furan, pyran, isobenzofuran, chromene, xanthene, phenoxazine, pyrrole, pyrazole, isothiazole, isoxazole, pyrazine, pyrimidine, pyridazine, indolysine, isoindolysine, indoyl, indazole, prine, quinolizine, isoquinoline, phthalazine, naphthyridine, quinazoline, cinnoline, pteridine, carbazole, carboline, phenanthroline, acridine, perimidine, phenanthroline, phenarsazine, and furazan, which may be further benzo-condensed ring, or may be substituted.

Examples of the alkenyl group include a vinyl group, a 1-propenyl group, a 1-butenyl group, a cinnamoyl group, and a 2-chloro-1-ethenyl group, and examples of the alkynyl group include an ethynyl group, a 1-propynyl group, a 1-butynyl group, and a trimethylsilylethynyl group. Examples of GI in the acyl group (G1CO—) include a hydrogen atom, and the above-described alkyl group and aryl group. Among these substituents, more preferable examples include a halogen atom (—F, —Br, —Cl, and —I), an alkoxy group, an aryloxy group, an alkylthio group, an arylthio group, a N-alkyl amino group, a N,N-dialkylamino group, an acyloxy group, a N-alkylcarbamoyloxy group, a N-arylcarbaminoyloxy group, an acylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N-alkyl-N-arylcarbamoyl group, a sulfo group, a sulfonate group, a sulfamoyl group, a N-alkylsulfamoyl group, a N,N-dialkylsulfamoyl group, a N-arylsulfamoyl group, a N-alkyl-N-arylsulfamoyl group, a phosphono group,a phosphonate group, a dialkylphosphono group, a diarylphosphono group, a monoalkylphosphono group, an alkylphosphonate group, a monoarylphosphono group, an arylphosphonate group, a phosphonooxy group, a phosphonateoxy group, an aryl group, an alkenyl group, and an alkylidene group (e.g. methylene group).

Examples of the alkylene group in the substituted alkyl group include a divalent organic residue obtained by removing any one of the hydrogen atoms on the above-described alkyl group having 1 to 20 carbon atoms, and preferable examples thereof include a linear alkylene group having 1 to 12 carbon atoms, a branched alkylene group having 3 to 12 carbon atoms, and a cyclic alkylene group having 5 to 10 carbon atoms.

Specific examples of the substituted alkyl group which is obtained by combining the above-described substituent with an alkylene group and is preferable as $R^1$, $R^2$, or $R^3$ include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, a N-cyclohexylcarbamoyloxyethyl group, a N-phenylcarbamoyloxyethyl group, an acetylaminoethyl group, a N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, a N-methylcarbamoylethyl group, a N,N-dipropylcarbamoylmethyl group, a N-(methoxyphenyl) carbamoylethyl group, a N-methyl-N-(sulfophenyl)carbamoylmethyl group, a sulfobutyl group, a sulfonatepropyl group, a sulfonatebutyl group, a sulfamoylbutyl group, a N-ethylsulfamoylmethyl group, a N,N-dipropylsulfamoylpropyl group, a N-tolylsulfamoylpropyl group, a N-methyl-N-(phosphonophenyl)sulfamoyloctyl group, a phosphonobutyl group, a phosphonatehexyl group, a diethylphosphonobutyl group, a diphenylphosphonopropyl group, a methylphosphonobutyl group, a methylphosphonatebutyl group, a tolylphosphonohexyl group, a tolylphosphonatehexyl group, a phosphonooxypropyl group, a phosphonateoxybutyl group, a benzyl group, a phenethyl group, an a-methylbenzyl group, a 1-methyl-1-phenylethyl group, a p-methylbenzyl group, a cinnamoyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

Specific examples of the aryl group preferable as $R^1$, $R^2$, or $R^3$ include a condensed ring formed by 1 to 3 benzene rings, and a condensed ring formed by a benzene ring and a 5-membered unsaturated ring, and specific examples thereof include a phenyl group, a naphthyl group, an anthryl group, a phenanthryl group, an indenyl group, an acenaphthenyl group, and a fluorenyl group. Among these groups, a phenyl group, and a naphthyl group are more preferable.

Specific examples of the substituted aryl group preferable as $R^1$, $R^2$, or $R^3$ include a the above-described aryl group having a monovalent group of nonmetal atoms (excluding hydrogen atoms) as a substituent on the carbon atom forming the ring. Preferable examples of the substituent include the above-described alkyl group, substituted alkyl group, and examples of the substituents in the alkyl group. Specific preferable examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, a N-cyclohexylcarbamoyloxyphenyl group, a N-phenylcarbamoyloxyphenyl group, an acetylaminophenyl group, a N-methyl-benzoylaminophenyl group, a carboxyphenyl group, a methoxycarbonylphenyl group, an allyloxycarbonylphenyl group, a chlorophenoxycarbonylphenyl group, a carbamoylphenyl group, a N-methylcarbamoylphenyl group, a N,N-dipropylcarbamoylphenyl group, a N-(methoxyphenyl)carbamoylphenyl group, a N-methyl-N-(sulfophenyl) carbamoylphenyl group, a sulfophenyl group, a sulfonatephenyl group, a sulfamoylphenyl group, a N-ethylsulfamoylphenyl group, a N,N-dipropylsulfamoylphenyl group, a N-tolylsulfamoylphenyl group, a N-methyl-N-(phosphonophenyl)sulfamoylphenyl group, a phosphonophenyl group, a phosphonatephenyl group, a diethylphosphonophenyl group, a diphenylphosphonophenyl group, a methylphosphonophenyl group, a methylphosphonatephenyl group, a tolylphosphonophenyl group, a tolylphosphonatephenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group, and 3-butynylphenyl group.

Particularly preferable examples of $R^2$ and $R^3$ include a substituted or unsubstituted alkyl group. More preferable examples of $R^1$ include a substituted or unsubstituted aryl group. The reason for this is not evident, but is considered that these substituents particularly strengthen the interaction between electrons excited upon light absorption and the initiator compound, which improves the efficiency of the initiator compound to generate a radical, acid, or base.

In the next place, A in the formula (XVIII) is further described. A represents an optionally substituted aromatic ring or heterocycle, and specific examples of the optionally substituted aromatic ring or heterocycle include the same examples as those listed in the above-described description of $R^1$, $R^2$, or $R^3$ in the formula (XVIII).

Among them, preferable examples of A include an aryl group having an alkoxy group, a thioalkyl group, or an amino group, and particularly preferable examples of A include an aryl group having an amino group.

In the next place, Y in the formula (XVIII) is further described. Y represents a group of nonmetal atoms necessary for forming a heterocycle together with the above-described A and the adjacent carbon atom. Examples of the heterocycle include a 5-, 6-, or 7-membered nitrogen-containing or sulfur-containing heterocycle which may have a condensed ring. Among them, a 5- or 6-membered heterocycle is preferable.

Preferable examples of the nitrogen-containing heterocycle include those known as a component of basic nuclei in melocyanine dyes described in L. G. Brooker et al., J. Am, Chem. Soc., vol. 73 (1951), pp. 5326-5358 and reference documents cited therein. Specific examples thereof include, thiazoles (e.g. thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole, and 4,5-di(2-furyl)thiazole), benzothiazoles (e.g. benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylene benzothiazole, 5-hydroxybenzothiazole, 6-hydroxybenzothiazole, 6-dimethylaminobenzothiazole, and 5-ethoxycarbonylbenzothiazole), naphthothiazoles (e.g. naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole, and 7-methoxynaphtho[1,2]thiazole), thianaphtheno-7',6',4,5-thiazoles (e.g. 4'-methoxythianaphtheno-7',6',4,5-thiazole), oxazoles (e.g. 4-methyloxazole, 5-methyloxazole, 4-phenyloxazole, 4,5-diphenyloxazole, 4-ethyloxazole, 4,5-dimethyloxazole, and 5-phenyloxazole), benzoxazoles (e.g. benzoxazole, 5-chlorobenzoxazole, 5-methyl benzoxazole, 5-phenylbenzooxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, and 6-hydroxybenzoxazole), naphthooxazoles (e.g. naphtho[1,2]oxazole and naphtho[2,1]oxazole), selenazoles(e.g. 4-methylselenazole and 4-phenylselenazole), benzoselenazoles (e.g. benzoselenazole, 5-chlorobenzoselenazole, 5-methoxybenzoselenazole, 5-hydroxybenzoselenazole, and tetrahydrobenzoselenazole), naplithoselenazoles (e.g. naphtho[1,2]selenazole, and naphtho[2,1]selenazole), thiazolines (e.g. thiazoline, 4-methylthiazoline, 4,5-dimethylthiazoline, 4-phenylthiazoline, 4,5-di(2-furyl)thiazoline, 4,5-diphenylthiazoline, and 4,5-di(p-methoxyphenyl)thiazoline), 2-quinolines (e.g. quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, and 8-hydroxyquinoline), 4-quinolines (e.g. quinoline, 6-methoxyquinoline, 7-methylquinoline, and 8-methylquinoline), 1-isoquinolines (e.g. isoquinoline and 3,4-dihydroisoquinoline), 3-isoquinolines (e.g. isoquinoline), benzimidazoles (e.g. 1,3-dimethylbenzimidazole, 1,3-diethylbenzimidazole, and 1-ethyl-3-phenylbenzimidazole), 3,3-dialkylindolenines (e.g. 3,3-dimethylindolenine, 3,3,5-trimethylindolenine, and 3,3,7-trimethylindolenine), 2-pyridines (e.g. pyridine and 5-methyl pyridine), and 4-pyridine (e.g. pyridine). These ring substituents may be combined with each other to form a ring.

Examples of the sulfur-containing heterocycle include dithiol partial structures in dyes described in JP-A No. 3-296759. Specific examples thereof include benzodithiols (e.g. benzodithiol, 5-t-butylbenzodithiol, and 5-methylbenzodithiol), naphthodithiols (e.g. naphtho[1,2]dithiol and naphtho[2,1]dithiol), dithiols (e.g. 4,5-dimethyldithiols, 4-phenyldithiols, 4-methoxycarbonyldithiols, 4,5-dimethoxycarbonyldithiols, 4,5-diethoxycarbonyldithiols, 4,5-ditrifluoromethyldithiol, 4,5-dicyano dithiol, 4-methoxycarbonylmethyldithiol, and 4-carboxymethyldithiol).

In the formula (XVIII), among the examples of nitrogen-containing or sulfur-containing heterocycles formed by Y together with the above-described A and adjacent carbon atom, the dye having a structure represented by the partial structural formula of the following formula (XVIII-2) is particularly preferable because it offers a photosensitive composition having high sensitizing capacity and very excellent storage stability. Examples of the dye having the partial structure represented by the formula (XVIII-2) is cited in detail as new compounds in a specification of Japanese Patent Application Laid-Open (JP-A) No. 2004-318049.

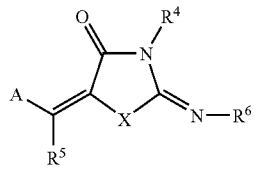

(XVIII-2)

In the formula (XVIII-2), A represents an optionally substituted aromatic ring or heterocycle, and X represents an oxygen atom, a sulfur atom, or —N(R$^1$)—. R$^1$, R$^4$, R$^5$, and R$^6$ each independently represents a hydrogen atom or a monovalent group of nonmetal atoms, and A, R$^1$, R$^4$, R$^5$, and R$^6$ may be combined with each other to form an aliphatic or aromatic ring. In the formula (XVIII-2), A and R$^1$ are each equivalent to those in the formula (XVIII), R$^4$ is equivalent to R$^2$ in the formula (XVIII), R$^5$ is equivalent to R$^3$ in the formula (XVIII), and R$^6$ is equivalent to R$^1$ in the formula (XVIII).

In the next place, compound represented by the following formula (XVIII-3), which is a preferable exemplary embodiment of the compound represented by the formula (XVIII), is further described.

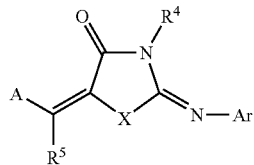

(XVIII-3)

In the formula (XVIII-3), A represents an optionally substituted aromatic ring or heterocycle, and X represents an oxygen atom, a sulfur atom, or —N(R$^1$)—. R$^1$, R$^4$, and R$^5$ are each independently a hydrogen atom or a monovalent group of nonmetal atoms, and A, R$^1$, R$^4$, and R$^5$ may be combined with each other to form an aliphatic or aromatic ring. Ar represents a substituted aromatic ring or heterocycle. The sum total of the Hammett's values of the substituents on the Ar skeleton must be greater than 0. The "sum total of Hammett's values is larger than 0" as used herein may be that one substituent is present and the Hammett's value of the substituent is larger than 0 or that a plurality of substituents are present and the sum total of the Hammett's values of these substituents is larger than 0.

In the formula (XVIII-3), A and R$^1$ are equivalent to those in the formula (XVIII), R$^4$ is equivalent to R$^2$ in the formula (XVIII), and R$^5$ is equivalent to R3 in the formula (XVIII). Ar represents a substituted aromatic ring or heterocycle, and specific examples thereof include the same specific examples of the substituted aromatic ring or heterocycle as those listed for A in the description of the formula (XVIII). The total sum of the Hammett's values of the substituents to be introduced into Ar in the formula (XVIII-3) must be 0 or more. Examples of the substituents include a trifluoromethyl group, a carbonyl group, an ester group, a halogen atom, a nitro group, a cyano group, a sulfoxide group, an amide group, and a carboxyl group. The Hammett's value of these substituents are as follows: trifluoromethyl group (—CF$_3$, m: 0.43, p: 0.54); carbonyl group (e.g. —COH, m: 0.36, p: 0.43); ester group (—COOCH$_3$, m: 0.37, p: 0.45); halogen atom (e.g. Cl, m: 0.37, p: 0.23); cyano group (—CN, m: 0.56, p: 0.66); sulfoxide group (e.g. —SOCH$_3$, m: 0.52, p: 0.45); amide group (e.g. —NHCOCH$_3$, m: 0.21, p: 0.00); and carboxyl group (—COOH, m: 0.37, p: 0.45). The site of the substituent in the aryl skeleton and the Hammett's value of the substituent are listed inside the parentheses, and (m: 0.50) means that the Hammett's value of the substituent upon introduction into the meta position is 0.50. Preferable examples of Ar include a substituted phenyl group, and preferable examples of the substituent on the Ar skeleton include an ester group and a cyano group. The substituent is particularly preferably located in the ortho position on the Ar skeleton.

Specific preferable examples of sensitizing dyes represented by Formula (XVIII) according to the present invention are shown in [exemplary compound (F-1) to exemplary compound (F-56)] below, however, the present invention is not limited thereto.

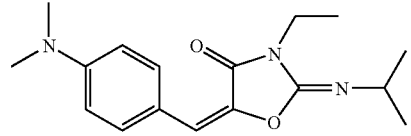

(F1)

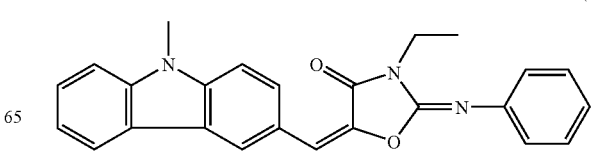

(F2)

(F3) 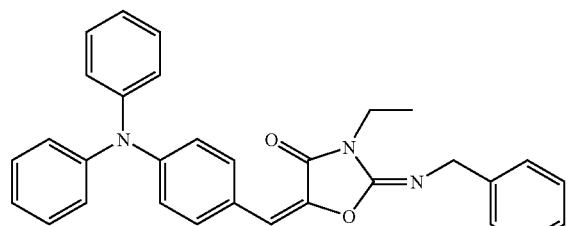
(F4) 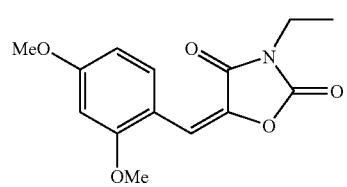
(F5) 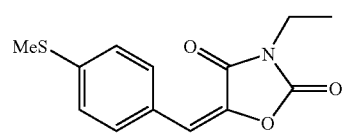
(F6) 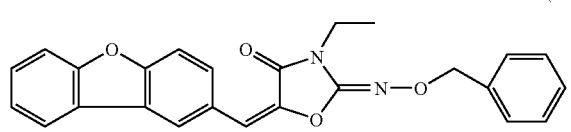
(F7) 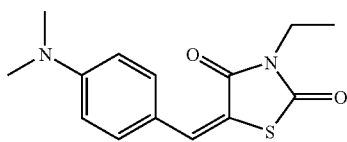
(F8) 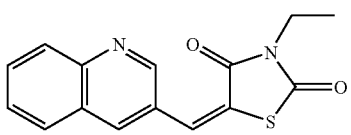
(F9) 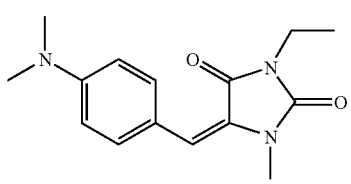
(F10) 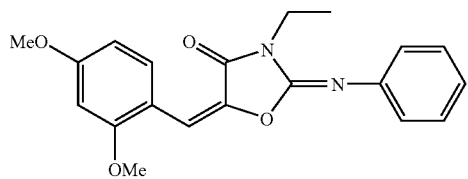
(F11) 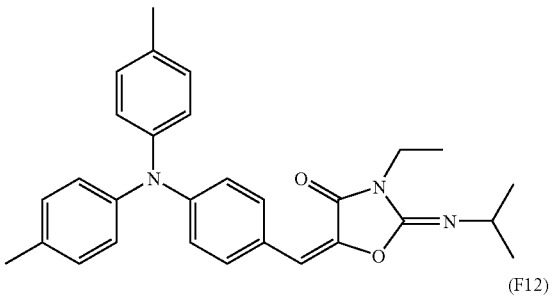
(F12) 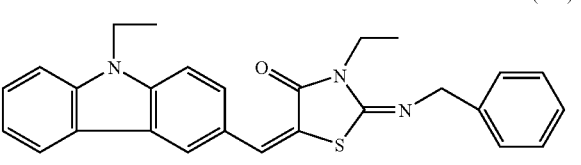
(F13) 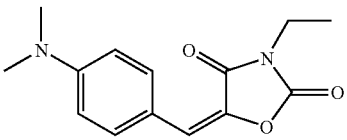
(F14) 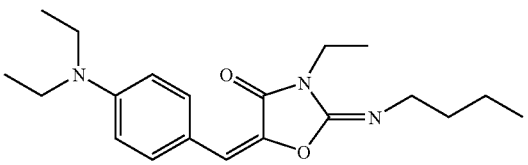
(F15) 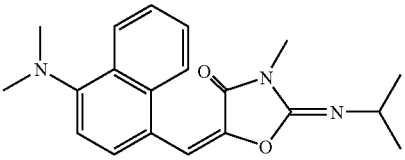
(F16) 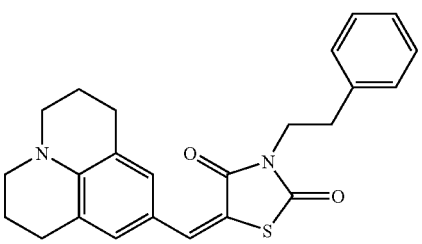
(F17) 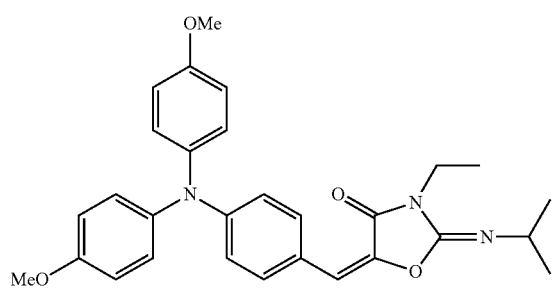

(F18) 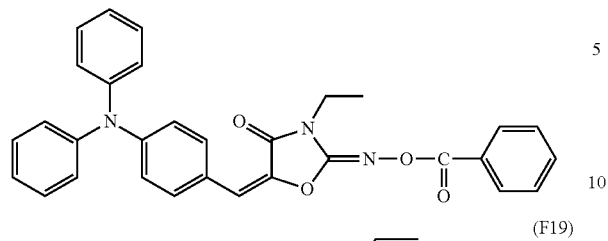
(F19) 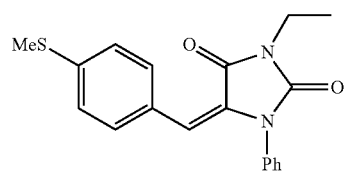
(F20) 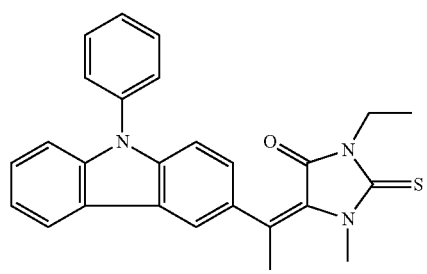
(F21) 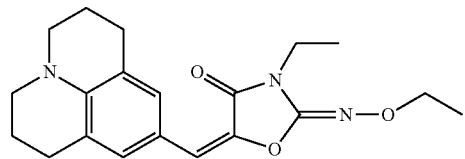
(F22) 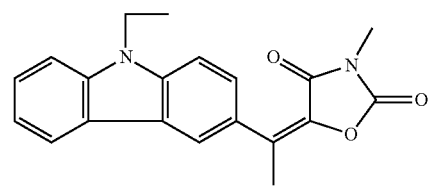
(F23) 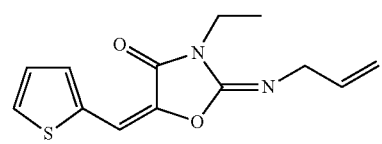
(F24) 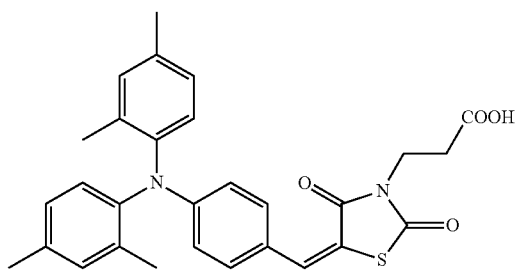
(F25) 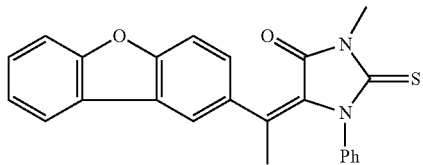
(F26) 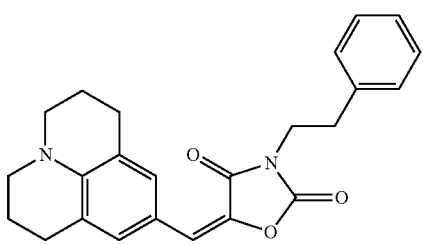
(F27) 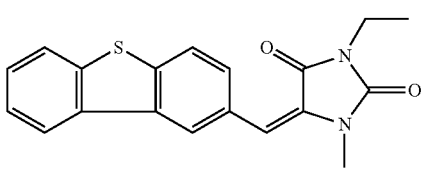
(F28) 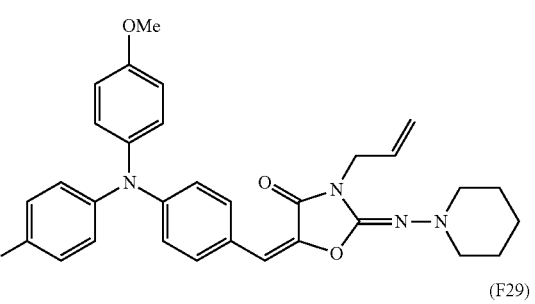
(F29)
(F30)
(F31) 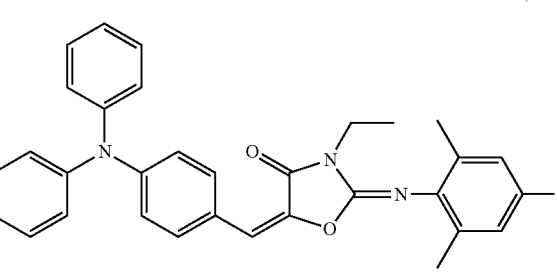

-continued
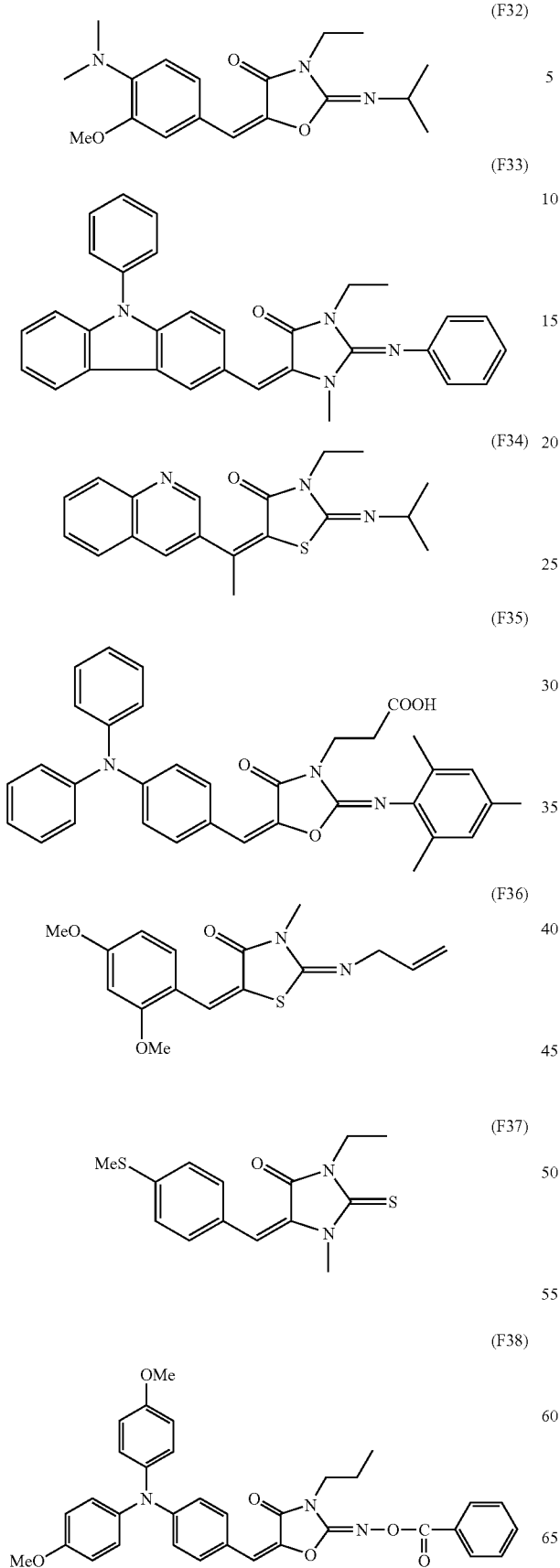
-continued
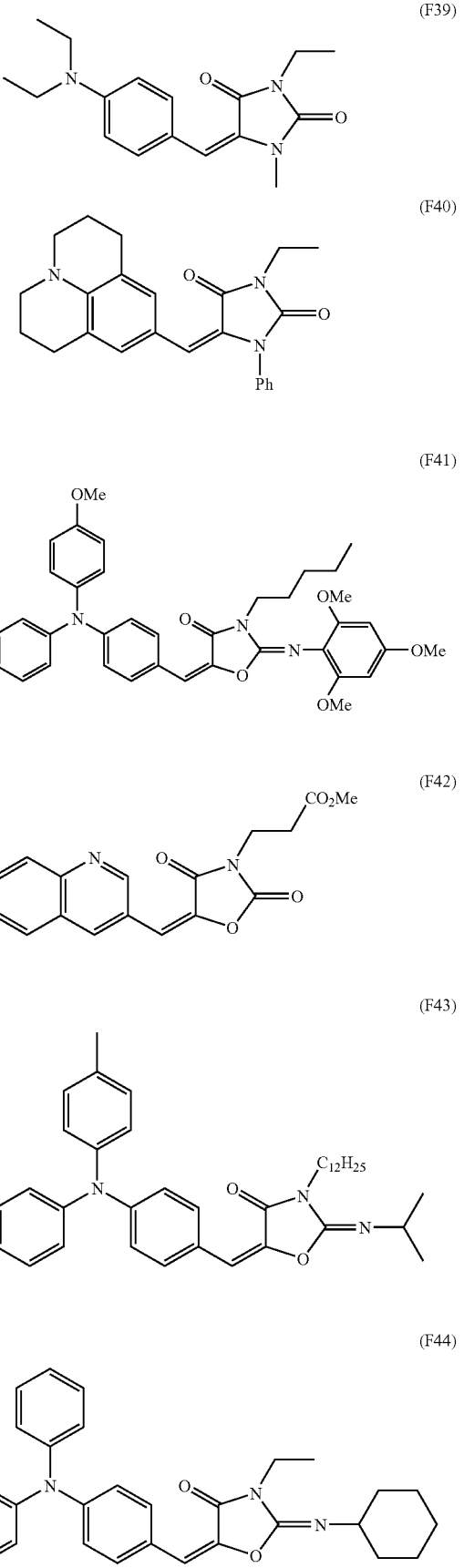

-continued
(F45)
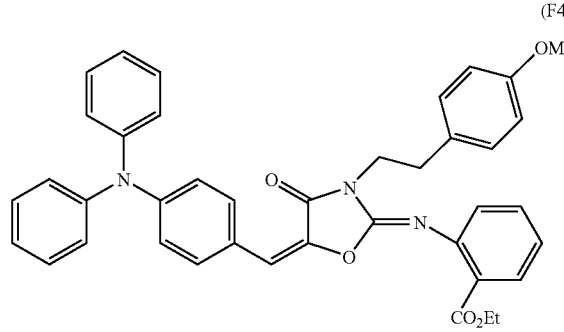
(F46)
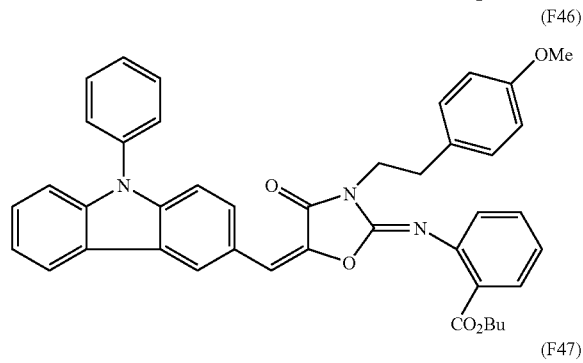
(F47)
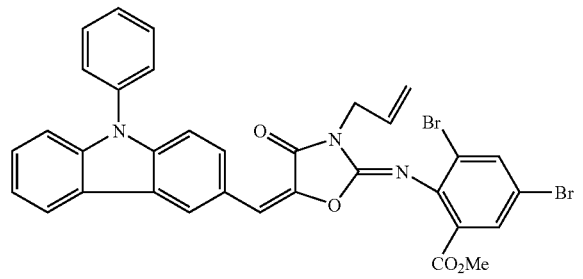
(F48)
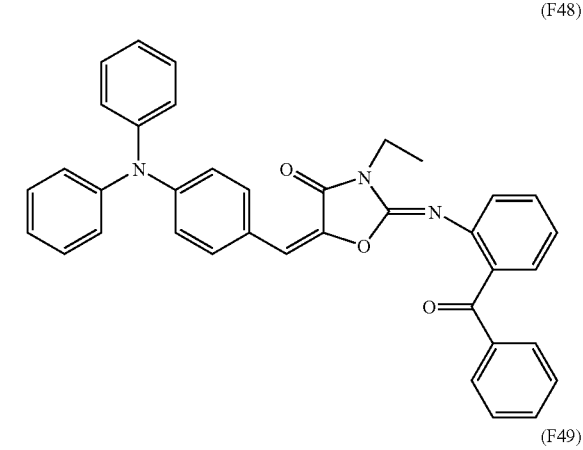
(F49)
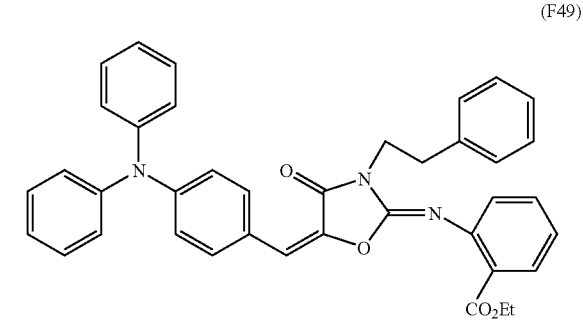
-continued
(F50)
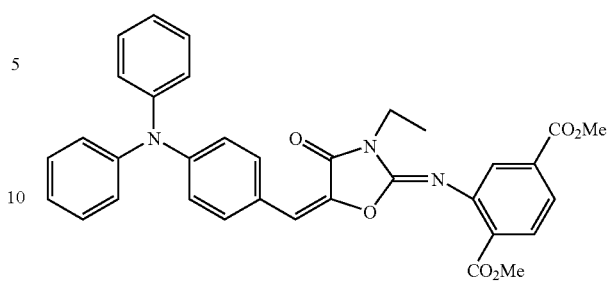
(F51)
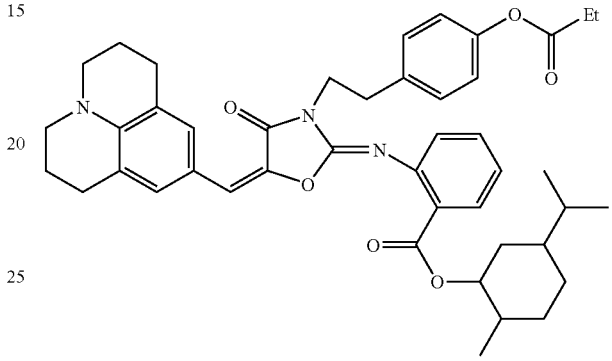
(F52)
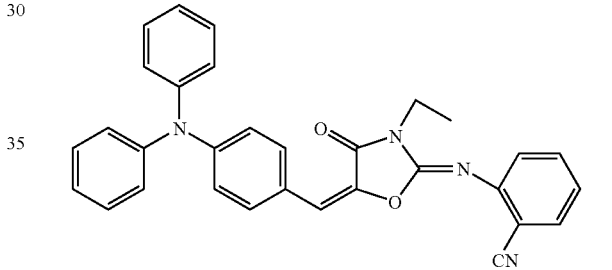
(F53)
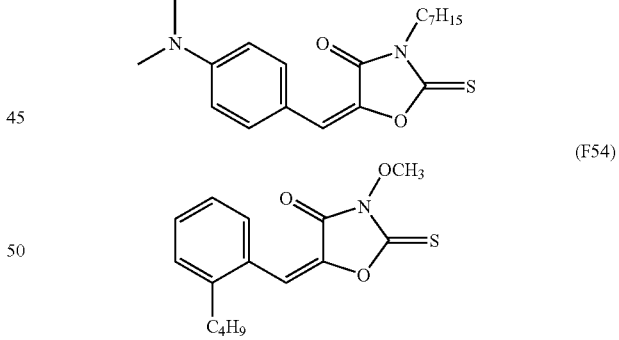
(F54)
(F55)
(F56)
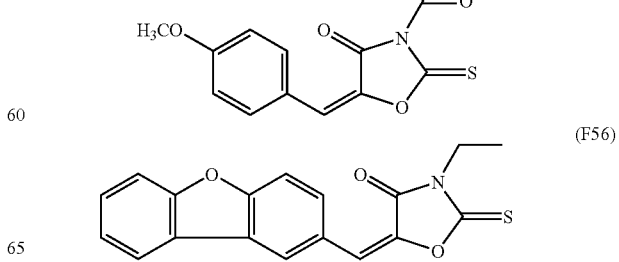

The compounds represented by Formula (XVIII) from among the sensitizing dyes applicable to the present invention are preferable from the standpoint of curability of the lower portions.

With respect to the sensitizing dyes, the following various chemical modifications may be performed thereto in order to improve the characteristics of the photosensitive composition of the present invention. For example, by combining the sensitizing dye with an additional polymerizable compound structure (for example, an acryloyl group or a methacryloyl group) using methods such as a covalent bond, an ionic bond, or a hydrogen bond, an improvement in the strength of the cross-linked curing layer and an improvement in the ability to suppress unwanted precipitation of the dye from the cross-linked curing layer can be obtained.

The amount contained of the sensitizing dye is preferably 0.01 mass % to 20 mass %, is more preferably 0.01 mass % to 10 mass %, and still more preferably 0.1 mass % to 5 mass %, with respect to the total solids of the colored photosensitive composition for color filters of the present invention.

The amount contained of the sensitizing dye within these ranges is preferable since there is high sensitivity to the exposure wavelengths of an ultrahigh pressure mercury lamp, and curability of the lower layer portions may be obtained, and these ranges are also preferable in terms of developing margin and pattern forming characteristics.

The kind of the photopolymerization initiator (D) is suitably selected according to the use of the later described colored pattern, and, for example, when the purpose is for colored pixel formation of a color filter for a liquid crystal display application, triazine initiators, biimidazole initiators, and the like are preferable, triazine initiators and an oxime initiators are preferable when the purpose is for black-matrix formation, and oxime initiators are preferable when the purpose is for colored pixel formation for a solid-state image sensing device. The amount contained in the colored curable composition of (D) the photopolymerization initiator is preferably 0.1 mass % to 10.0 mass %, and is more preferably 0.5 mass % to 5.0 mass %, with respect to the total solids of the composition. When the amount contained of the photopolymerization initiator is within these ranges there is good polymerization reaction promotion and film formation with good strength is possible.

[Solvent (E)]

Generally the colored curable composition of the present invention can be appropriately prepared by using a solvent with each of the components described above.

Examples of solvents that may be used therefor include: esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate; 3-oxypropionic acid alkyl esters, such as methyl 3-oxypropionate, and ethyl 3-oxypropionate; methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, ethyl 2-oxobutanoate; ethers, for example diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate, propylene glycol propyl ether acetate, ethyl carbitol acetate, butyl carbitol acetate, and the like; ketones, for example, methyl ethyl ketone, cyclohexanone, 2-heptanone, and 3-heptanone; aromatic hydrocarbons, for example, toluene, such as xylene; and the like.

Preferable among these are methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether acetate, and the like.

The solvents may be used singly or in combinations of two or more thereof.

[Other Components]

Various additives can be included in the colored curable composition of the present invention, as required, as long as there is no detriment to the effect of the present invention. Examples of such additives include a chain transfer agent, a fluoro organic compound, a thermal-polymerization initiator, a thermal-polymerization component, a thermal-polymerization inhibitor, and also a filler, a polymer compounds other than the above alkali soluble resins, a surfactant, an adhesion promoter, an antioxidant, an ultraviolet absorber, an aggregation inhibitor, or the like.

(Chain Transfer Agent)

Examples of the chain transfer agent which can be added to the colored curable composition of the present invention include, alkyl esters of N,N-dialkylamino benzoic acid, such as N,N-dimethylaminobenzoic acid ethyl ester, mercapto compounds that contain heterocycles, such as 2-mercaptobenzothiazole, 2-mercaptobenzoxazole, and 2-mercaptobenzimidazole, aliphatic polyfunctional mercapto compounds, and the like.

The chain transfer agents may be used singly or in combinations of two or more thereof.

(Fluoro Organic Compound)

By including a fluoro organic compound, liquid characteristics (in particular flowability) can be raised when the colored photosensitive composition of the present invention is a coating liquid, and the uniformity of coating thickness, and ability to save on liquid used can be improved. Namely, the colored photosensitive composition containing a fluoro organic compound has improved wettability to a coated face and the coatability of a coated face is improved, since the surface tension between the coated face and the coating liquid is reduced. Therefore, such an embodiment is effective for enabling film formation with little unevenness at a uniform thickness, even when a thin layer is formed of the order of several μm thickness using a small amount of liquid.

The fluorine content in the fluoro organic compound is preferably 3 mass % to 40 mass %, is more preferably 5 mass % to 30 mass %, and is particularly preferably 7 mass % to 25 mass %. Effective coating thickness uniformity and ability to save on liquid used is obtained when the fluorine content being this within these ranges, and the solubility with the composition is also good.

Examples of the fluoro organic compound include MEGAFAC F 171, MEGAFAC F 172, MEGAFAC F 173, MEGAFAC F 177, MEGAFAC F 141, MEGAFAC F 142, MEGAFAC F143, MEGAFAC F144, MEGAFAC R30, and MEGAFAC F437 (trade names, made by Dainippon Inc and Chemicals, Inc.), FLUORAD FC430, FLUORAD FC431 and FLUORAD FC171 (trade names, made by Sumitomo 3M), SURFLON S-382, SURFLON SC-101, SURFLON SC-103, SURFLON SC-104, SURFLON SC-105, SURFLON SC1068, SURFLON SC-381, SURFLON SC-383, SURFLON S393, SURFLON KH-40 (trade names, made by Asahi Glass Co., Ltd.), and the like.

Fluoro organic compounds having a fluoroalkyl group or a fluoroalkylene group at at least one of a terminal, main chain, and/or side chain of the compound are preferably used as the fluorosurfactant. Examples of specific commercial products thereof include MEGAFAC F142D, MEGAFAC F172, MEGAFAC F173, MEGAFAC F176, MEGAFAC F177, MEGAFAC F183, MEGAFAC 780, MEGAFAC 781, MEGAFAC R30, MEGAFAC R08, MEGAFAC F-472 SF, MEGAFAC BL20, MEGAFAC R-61, MEGAFAC R-90 (trade names, made by Dainippon Ink), FLUORAD FC-135, FLUORAD FC-170C, FLUORAD FC-430, FLUORAD FC-431, NOVEC FC-4430 (trade name, made by Sumitomo 3M), ASAHI GUARD AG7105, 7000, 950, 7600, SURFLON S-112, SURFLON S-113, SURFLON S-131, SURFLON S-141, SURFLON S-145, SURFLON S-382, SURFLON SC-101, SURFLON SC-102, SURFLON SC-103, SURFLON SC-104, SURFLON SC-105, SURFLON SC-106 (trade names, made by Asahi Glass Co., Ltd.) and EFTOP EF351, EFTOP 352, EFTOP 801, EFTOP 802 (trade name, made by JEMCO), and the like.

The fluoro organic compound is particularly effective for prevention of coating unevenness or thickness unevenness when using the colored photosensitive composition of the present invention to form a thin coated layer. The fluoro organic compound is also effective when applying the colored photosensitive composition of the present invention to a slit coating in which readily causes lack of liquid.

The addition amount of the fluoro organic compound is preferably 0.001 mass % to 2.0 mass %, and is more preferably 0.005 mass % to 1.0 mass %, with respect to the total mass of colored photosensitive composition.

(Thermal Polymerization Initiator)

Including a thermal polymerization initiator in the colored photosensitive composition of the present invention is also effective.

Examples of the thermal polymerization initiator include various kinds of azo compounds and peroxide compounds.

Examples of the azo compounds include azobis compounds and examples of the peroxide compounds include ketone peroxide, peroxyketal, hydroperoxide, dialkyl peroxide, diacyl peroxide, peroxyester, and peroxydicarbonate.

(Thermal-Polymerization Component)

Including a thermal-polymerization component in the colored photosensitive composition of the present invention is also effective.

An epoxy compound can be used as the thermal-polymerization component in order to raise the strength of the coated layer formed with the colored photosensitive composition of the present invention. Examples of the epoxy compounds include a compound having two or more epoxy rings in its molecule, such as bisphenol-A epoxy compounds, cresol novolac epoxy compounds, biphenyl epoxy compounds, and alicyclic epoxy compounds. Examples of bisphenol-A epoxy compounds include EPOTOHTO YD-115, YD-118T, YD-127, YD-128, YD-134, YD-8125, YD-7011R, ZX-1059, YDF-8170, YDF-170 (trade names, made by Tohto Kasei Co., Ltd.), DENACOL EX-1101, EX-1102, and EX-1103 (trade name, made by Nagase Kasei Co., Ltd.), PRAXEL GL-61, GL-62, G101, and G102 (trade names, made by Daicel Chemical Industries, Ltd.), and the like, and also similar bisphenol-F epoxy compounds and bisphenol-S epoxy compounds. Epoxy acrylates, such as EBECRYL, 3700, 3701, 600 (trade names, made by Daicel UCB Ltd.) can also be used.

Examples of cresol novolac epoxy compounds include EPOTOHTO YDPN-638, YDPN-701, YDPN-702, YDPN-703, YDPN-704 (trade name, made by Tohto Kasei Co., Ltd.), DENACOL EM-125 (trade name, made by Nagase Kasei Co., Ltd.); examples of biphenyl epoxy compounds include 3, 5, 3',5'-tetramethyl-4,4' diglycidyl biphenyl, and the like. Examples of alicyclic epoxy compounds include CELLOXIDE 2021, 2081, 2083, 2085, EPOLEAD GT-301, GT-302, GT-401, GT-403, EHPE-3150 (trade names, made by Daicel Chemical Industries, Ltd.), SUNTOHTO ST-3000, ST-4000, ST-5080, ST-5100 (trade names, made by Tohto Kasei Co., Ltd.), and the like. Other examples of compound that may be used include 1,1,2,2-tetrakis (p-glycidyloxy phenyl) ethane, tris (p-glycidyloxy phenyl)methane, triglycidyl tris(hydroxyethyl) isocyanurate, diglycidyl o-phthalate, diglycidyl terephthalate, as well as amine epoxy resins EPOTOHTO YH-434, YH-434L, and glycidyl esters with bisphenol-A epoxy resin skeletons thereof which have been modified with a dimer acid.

(Surfactant)

Various kinds of surfactants may be added to the colored photosensitive composition of the present invention in order to improve the coatability thereof. Besides the above fluorosurfactants, various nonionic surfactants, cationic surfactants, and anionic surfactants can also be used as such a surfactant. Preferable among these are fluorosurfactants which have a perfluoroalkyl group and are non-ionic surfactants, and non-ionic surfactants.

Particularly preferable examples of non-ionic surfactants include non-ionic surfactants, such as polyoxyethylene alkyl ethers, polyoxyethylene alkylaryl ethers, polyoxyethylene alkyl esters, sorbitan alkyl esters, inonoglyceride alkyl esters, and the like. Specific non-ionic surfactants include: polyoxyethylene alkyl ethers, such as polyoxyethylene lauryl ether, polyoxyethylene stearyl ether, and polyoxyethylene oleyl ether; polyoxyethylene aryl ethers, such as polyoxyethylene octylphenyl ether, polyoxyethylene poly styrylated ether, polyoxyethylene tribenzyl phenyl ether, polyoxyethylene-propylene polystyryl ether, and polyoxyethylene nonylphenyl ether; polyoxyethylene dialkyl esters, such as polyoxyethylene dilaurate, polyoxyethylene distearate, sorbitan fatty acid esters, polyoxyethylene sorbitan fatty acid esters, ethylene diamine polyoxyethylene-polyoxypropylene condensates, and the like. Commmercially available products thereof by Kao Corporation, NOF Corporation, Takemoto Oil and Fat Co., Ltd., Adeka Corporation, Sanyo Chemical Industries, Ltd, and the like can be suitably applied therefor. Besides these, the dispersants described above are also usable as the surfactant.

(Other Additives)

Various kinds of additives can be added to the colored photosensitive composition of the present invention besides those described above. Specific examples of such additives include: ultraviolet absorbers, such as 2-(3-t-butyl-5-methyl-2-hydroxyphenyl)-5-chlorobenzotriazole and alkoxybenzophenone; aggregation inhibitors, such as sodium polyacrylate; fillers, such as glass and alumina; alkali soluble resins, such as an itaconic acid copolymer, a crotonic acid copolymer, a maleic acid copolymer, a partially esterified maleic acid copolymer, an acidic cellulose derivative, a product formed by adding polymer having a hydroxyl group to an acid anhydride, an alcohol soluble nylon, a phenoxy resin formed from bisphenol A and epichlorohydrin, and the like.

The colored photosensitive composition of the invention preferably may further contain an organic carboxylic acid, which preferably has a low molecular weight of 1,000 or less, to accelerate dissolution of non-cured portions in alkali and further improve the developing property of the colored photosensitive composition. Specific examples thereof include aliphatic monocarboxylic acid, such as formic acid, acetic acid, propionic acid, butyric acid, valeric acid, pivalic acid, caproic acid, diethylacetic acid, enanthic acid, and caprylic acid; aliphatic dicarboxylic acid, such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, arid citraconic acid; aliphatic tricarboxylic acid, such as tricarballylic acid, aconitic acid, and camphoronic acid; aromatic monocarboxylic acid, such as benzoic acid, toluic acid, cuminic acid, hemellitic acid, and mesitylenic acid; aromatic polycarboxylic acid, such as phthalic acid, isophthalic acid, terephthalic acid, trimellitic acid, trimesic acid, mellophanic acid, and pyromellitic acid; and other carboxylic acid, such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetyl acid, coumaric acid, and umbellic acid.

A thermal-polymerization inhibitor may be added to the colored photosensitive composition of the present invention. Examples of compounds that may be used as the thermal-polymerization inhibitor include hydroquinone, p-methoxyphenol, di-t-butyl-p-cresol, pyrogallol, t-butylcatechol, benzoquinone, 4,4'-thiobis (3-methyl-6-t-butylphenol), 2,2'-methylenebis (4-methyl-6-t-butylphenol), 2-mercaptobenzimidazole, and the like.

The colored photo-curable composition of the present invention can be prepared by adding the alkali soluble resin (B), the photo-polymerizable compound (C), the photopolymerization initiator (D), the solvent (E), and, as required, other additives, such as a surfactant, to the pigment dispersion composition prepared in advance and containing the specific pigment (A) of the present invention and a solvent.

Since the colored light curable composition of the present invention includes the pigment (A) obtained with the specific manufacturing method, there is excellent dispersibility of the pigment, and also excellent color characteristics. Further, since a coated layer obtained by coating the colored photosensitive composition of the present invention to the surface of a solid body and drying has a contact angle to water of 60° or greater and is excellent in hydrophilicity, when solvent and water contacts the dried coated layer there is rapid dissolution and disperse thereof, the generation is suppressed of foreign matter resulting from nozzle blockage when slit coating, and there is excellent removability of the uncured coated layer.

Therefore, a colored pattern obtained by coating the colored photosensitive composition on a substrate, exposing and curing has excellent uniformity and is also preferably applied for forming the colored regions of color filters requiring not only image forming materials but also color characteristics with excellent transparency, namely, the colored pattern of colored pixels or a black matrix.

<Color Filter>

The color filter of the present invention is the colored pattern using the colored photosensitive composition of the present invention formed on a substrate.

The colored pattern here encompasses both three color/four color colored patterns (pixel portions) and a black matrix.

Explanation will now be given of the manufacturing method of the color filter of the present invention. First, the colored photosensitive composition of the present invention is coated on a substrate, either directly or via other layers, using a coating method, such as rotation coating, slit coating, cast coating, roll coating, bar coating, or the like, thereby forming a coated layer including the colored photosensitive composition (coating process). Then, the coated layer is exposed via a specific mask pattern (exposure process). After exposure, development/removal of the non-cured portions of the coated layer is carried out with a developing liquid (development process). By passing through these processes, a colored pattern for the pixels of each color (three colors or four colors), or a black matrix is formed, and the color filter can be obtained. By such a method, there are few difficulties in the process for forming a color filter for a liquid crystal display element or a solid-state image sensing device, and high quality and low cost production is possible. The color filter of the present invention is particular applicable to formation of liquid crystal display elements of large surface area, since the photosensitive composition of the present invention is excellent in the hydrophilicity of the dry coated layer and has excellent slit coating characteristics, a remarkable effect of the invention. Explanation will now be given of details of each of these processes.

[Coating Process]

First, the substrate used in the coating process will be explained. Examples of substrates used for the color filter of the present invention include substrates used for liquid crystal display elements, such as alkali-free glass, soda glass, Pyrex (registered trademark) glass, and quartz glass, such substrates with a transparent conductive layer adhered thereto, and photoelectric conversion element substrates used for solid-state image sensing devices and the like, for example, silicon substrates and plastic substrates. A black matrix separating each pixel may be formed on these substrates and/or a transparent resin layer may be provided in order to promote adhesion and the like. A gas barrier layer and/or a solvent resistant layer is preferably provided on the surface of plastic substrates.

Besides these substrates, substrates for driving on which thin-film transistors (TFTs) have been disposed for thin-film transistor (TFT) color liquid crystal displays (referred to below as "substrates for TFT liquid crystal driving") can used, a colored pattern which uses the colored photosensitive composition of the present invention can also be formed on this substrate for driving, and a color filter can be produced thereby. Examples of substrates used for substrates for TFT liquid crystal driving include glass, silicone, polycarbonate, polyester, aromatic polyamides, polyamidoimides, and polyimides. These substrates may be subjected to appropriate pretreatment, such as chemical treatment with a silane coupling agent or the like, plasma treatment, ion plating, sputtering, vapor phase reaction, vacuum deposition, or the like, as desired. Substrates can be used with, for example, passivation films, such as a silicon nitride film, formed on the surface of substrates for TFT liquid crystal driving.

In the coating process, the method of coating the colored photosensitive composition of the present invention to the substrate is not particularly limited, and methods using slit-nozzles (referred to below as slit-nozzle coating methods), such as slit-and-spin coating methods and spinless coating methods, are preferable. In slit-nozzle coating methods, although conditions differ in slit-and-spin coating methods and spinless coating methods depending on the size of the coating substrate, when, for example, coating a fifth generation glass substrate (1100 mm×1250 mm) by a spinless coating method, the jetting amount of the colored photosensitive composition from the slit nozzle is usually 500 to 2000 microliters/second, and is preferably 800 to 1500 microliters/second, with the coating velocity usually being 50 to 300 mm/second and preferably being 100 to 200 mm/second. The solids content of the colored photosensitive composition used in the coating process is usually 10% to 20%, and preferably 13% to 18%.

When forming the coated layer on the substrate with the colored photosensitive composition of the present invention, the thickness of the coated layer (after prebaking treatment) is generally 0.3 µm to 5.0 µm, preferably 0.5 µm to 4.0 µm, and most preferably 0.5 µm to 3.0 µm. When the color filter is for a solid-state image sensing device the thickness of the coated layer (after prebaking treatment) is preferably within the range of 0.5 µm to 2.0 µm.

Prebaking treatment is usually preformed after carrying out coating in a coating process. Vacuum treatment can also be performed, as required, before prebaking. The amount of vacuum applied in vacuum drying is usually about 0.1 torr to 1.0 torr, and is preferably about 0.2 torr to 0.5 torr. Prebaking treatment can be performed using a hot plate, oven, or the like, under conditions of a temperature range of 50° C. to 140° C., preferably about 70° C. to 110° C., for 10 to 300 seconds. Radio frequency treatment or the like may be used together with the prebaking treatment. Radio frequency treatment may also be used independently thereof.

[Exposure Process]

In an exposure process, exposure via a specific mask pattern is carried out to the coated layer formed, as described above, from the colored photosensitive composition.

Ultraviolet rays, such as g-line, h-line, i-line, and j-line, are particularly preferable for the radiation used when carrying out exposure (light-exposure).

It should be noted that when manufacturing a color filter for a liquid crystal display, light-exposure mainly of h-line and i-line using a proximity light-exposure machine, or a mirror projection light-exposure machine, is preferable.

Light-exposure using a stepper light-exposure machine is preferable when manufacturing a color filter for a solid-state image sensing device mainly i-line.

When manufacturing a color filter using a substrate for TFT method liquid crystal driving, besides a photomask used for providing a pattern for forming pixels (colored pattern), a photomask for providing a pattern for forming a through hole or U-shaped indentation may also be used.

[Development Process]

In a development process, after carrying out light-exposure, the non-cured portions of the coated layer are dissolved in the developing liquid, and only the cured portions are left remaining on the substrate. The developing temperature is usually 20° C. to 30° C., and the developing time is usually 20 to 90 seconds. Anything can be used as the developing liquid as long as cured portions are not dissolved when dissolving the non-cured portions of the coated layer formed from the colored photosensitive composition. Specifically, various combinations of organic solvents and various alkaline aqueous solutions can be used.

The above described solvents used when preparing the colored photosensitive composition of the present invention can also be used as organic solvents for developing. Examples of the alkaline aqueous solutions include those prepared by dissolving alkaline compounds (such as, for example, sodium hydroxide, potassium hydroxide, sodium carbonate, sodium hydrogencarbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, or 1,8-diazacyclo-[5,4,0]-7-indecene). The concentration of the alkaline aqueous solution is 0.001 mass % to 10 mass %, and is preferably 0.01 mass % to 1 mass %. A suitable quantity of, for example, a water soluble organic solvent, such as methanol and ethanol, a surfactant, or the like, can also be added to the alkaline aqueous solution.

Any one of a dip method, a shower method, a spray method, or the like can be used as the developing method, and these may be combined with a swing method, a spin method, an ultrasonic method, or the like. The surface to be developed may also be wetted with water or the like in advance before the developing liquid is contacted thereto, in order to prevent uneven development. The substrate may also be inclined and developed. Paddle development is also used when manufacturing a color filter for a solid-state image sensing device.

After developing, rinsing is carried out to wash away excess developing liquid and then drying is performed. Then heat-treatment (post bake) is undertaken to complete curing. Although pure water is usually used for performing rinsing, in order to save water a method may be used in which pure water is used in the final washing stage and such processed pure water is recycled and used in previous washing stages, in combination with the substrate being inclined for washing, and/or ultrasound irradiation thereto.

After rinsing, draining and drying, heat-treatment (at about 200° C. to 250° C.) is usually performed. This heat-treatment (post bake) may be performed to the coated layer after developing by a continuous or batch heating method so as to achieve the above conditions using a heating device such as a hot plate, a convection oven (circulating hot air dryer), a radio frequency heating device, or the like.

A color filter formed from plural colors of cured layers (colored patterns) is producible by repeating for each color each of the above processes a number of times according to the desired number of hues.

With respect to the use of the colored photosensitive composition of the present invention, although explanation is mainly given focusing on application to a colored pattern of a color filter, the colored photosensitive composition is also applicable to formation of a black matrix separating colored patterns (pixels) configuring a color filter.

The black matrix can be formed on a substrate by carrying out each of the processes of coating, light-exposure, and developing using the colored curable composition containing processed pigments of black pigments, such as carbon black and titanium black, and then, as required, performing post bake thereto.

EXAMPLES

More specific explanation will now be given of the present invention using the Examples, however, the present invention is not limited the following Examples, as long as the main principles of the invention are not departed from. It should be noted that unless otherwise stated, "parts" refers to parts by mass.

Example 1

<Particle Micronization Treatment (Salt Milling) of Pigment Powder>

Sinter dried table salt (made by Ajishokuken Co., Ltd. (trade name: SOFT SALT S-50), Mg content 0.03%, moisture content 0.11%) was pulverized by a high velocity rotary mill (trade name: ACM-10A, made by Hosokawa Micron Corporation). When the particle size distribution of the pulverized salt was measured using a MICROTRAC particle size analyzer (trade name, made by Nikkiso Co., Ltd.), the volume basis median particle size was found to be 6.2 μm, and the 95 percentile particle size was found to be 12.8 μm. When the pulverized salt was observed with a scanning electron microscope, the salt particles were seen to have an angular shape with rough surfaces. 1000 parts of the obtained pulverized salt, 100 parts of ε-crystal form copper phthalocyanine pigment (C.I. Pigment Blue 15:6, made by Toyo Ink Manufacturing Co., Ltd. (trade name:Lionol Blue E)), and 110 parts of diethylene glycol were introduced into a 1-gallon kneader (made by Inoue Manufacturing Co., Ltd.), and mixing and kneading was carried out at 60° C. for 10 hours. Next, this kneaded material was introduced into 10 L of warm water, 1 hour of agitation using a high speed mixer was carried out while heating at about 80° C. to obtain a slurry state, this was filtered and washed with water, removing the table salt and diethylene glycol, and then, after drying for 24 hours at 80° C., pulverization was carried out and 94 parts of micronized ε-crystal form copper phthalocyanine pigment was obtained. The average primary particle size of this pigment powder was 25 nm, as measured by observation with an electron microscope (SEM).

<Preparation of Pigment Dispersion Composition>

The following compositions were agitated for 3 hours, by mixing at a rotation speed of 3,000 rpm using a homogenizer, and a mixture liquid was prepared.

| | |
|---|---|
| Pigment Blue 15:6 (above obtained pulverized pigment, average particle size by SEM observation 25 nm) | 14 parts |
| dispersion resin C: (compound of structure as shown below) | 2 parts |
| dispersant: (trade name: DISPERBYK-161, made by BYK Co., Ltd., 30% solution) | 3 parts |
| alkali soluble resin: (propylene glycol monomethyl ether acetate solution of benzyl methacrylate/methacrylate copolymer at 75/25 [mass ratio], weight average molecular weight Mw: 5000, solids content: 50 mass %) | 4 parts |
| solvent (propylene glycol monomethyl ether acetate) | 73 parts |

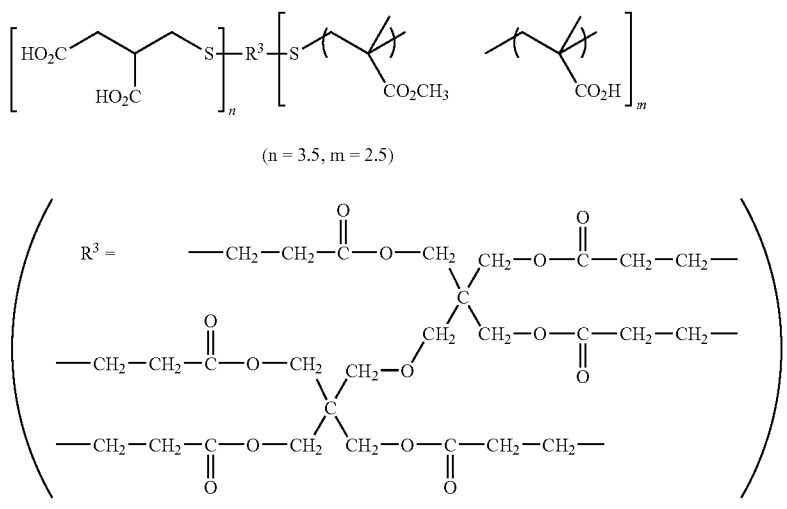

Then, the mixture liquid obtained as described above was further dispersion processed for 6 hours in a bead dispersion machine (ULTRA APEX MILL, trade name, made by Kotobuki Industries Co., Ltd.) using 0.1 mm φ zirconia beads, and the pigment dispersion composition was obtained.

<Preparation of Colored Curable Composition>

Components of the following compositions were further added to the above pigment dispersion composition, agitation mixing was carried out, and a colored photosensitive composition (color resist liquid) of Example 1 was prepared.

| | |
|---|---|
| above blue pigment containing pigment dispersion composition [containing pigment (A)] | 100 parts |
| alkali soluble resin (B): (propylene glycol monomethyl ether acetate solution of benzyl methacrylate/methacrylate copolymer at 75/25 [mass ratio], weight average molecular weight Mw: 5000, solids content: 50 mass %) | 10 parts |
| epoxy resin: (trade name: EHPE3150, made by Daicel Chemical Industries, Ltd.) | 2 parts |
| polymerizable compound (C): (dipentaerythritol hexaacrylate) | 12 parts |
| photopolymerization initiator (D): 4-(o-bromo-p-N,N-di(ethoxycarbonylmethyl) aminophenyl)-2,6-di(trichloromethyl)-s-triazine | 3 parts |
| polymerization inhibitor: p-methoxyphenol | 0.001 parts |
| fluorosurfactant: (trade name: MEGAFAC R08, made by Dainippon Ink and Chemicals, Inc.) | 0.02 parts |
| non-ionic surfactant: (trade name: EMULGEN A-60, made by Kao Corporation) | 1 part |
| solvent (E): (propylene glycol monomethyl ether acetate) | 170 parts |

The colored curable composition of Example 1 obtained was coated on a glass substrate (100 mm×100 mm, trade name 1737, made by Corning Incorporated) so as to give a layer thickness of 1.5 μm, and dried for 60 seconds in a 90° C. oven to form a dried coated layer. The static contact angle, measured using a Drop Master DM500 (trade name, made by Kyowa Interface Science Co., Ltd.) at 5 minutes after dripping DIW (deionized water) onto the dried layer at 25° C., was found to be 60°. For the surface roughness of the dry coated layer, the surface roughness of an area of 10-μm angle was measured using a NANO SCOPE IIIa (AFM) device (trade name, made by Digital Instruments) and found to be 5 nm.

Example 2

The colored curable composition (color resist liquid) of Example 2 was prepared in a similar manner to that of Example 1, except the amount of addition of the dispersion resin C added when preparing the pigment dispersion composition in Example 1 was changed to 5 parts. The contact angle of the dried coated layer of the colored curable composition of Example 2 with water, measured as in Example 1, was found to be 70°. When the surface roughness of the dry coated layer was measured in a similar manner the surface roughness was found to be 3 nm.

Comparative Example 1

The colored curable composition (color resist liquid) of Comparative Example 1 was prepared in a similar manner to that of Example 1, except that ε-crystal form copper phthalocyanine pigment (C.I. Pigment Blue 15:6, made by Toyo Ink Manufacturing Co., Ltd. (trade name:Lionol Blue E)) that had not been subjected to salt milling treatment was used, and the dispersion resin C was not added during pigment dispersion liquid preparation. The contact angle of the dried coated layer of the colored curable composition of Comparative Example 1 with water, measured as in Example 1, was found to be 50°. When the surface roughness of the dry coated layer was measured in a similar maimer the surface roughness was found to be 13 nm.

<Properties Evaluation>

The following evaluations were performed on the colored curable compositions obtained in Examples 1 and 2 and in Comparative Example 1. The results are shown in the following table 1. The solubility to solvent of the dry layer and the amount of foreign matter generation during coating was evaluated.

1. Solvent Solubility

The colored curable compositions were coated on a glass substrate (100 mm×100 mm, trade name 1737, made by Corning Incorporated) so as to give a layer thickness of 1.5 μm, this layer was dried naturally to obtain a dried coated layer, and the time taken for the dried coated layer to dissolve completely with propylene glycol monomethyl ether acetate, the main solvent of the colored photosensitive compositions, drops of 10 μl at room temperature was measured.

2. Coating Foreign Matter

The colored curable compositions were continuously coated on 100 plates of glass substrate (550 mm×650 mm, trade name 1737, made by Coming Incorporated) without performing nozzle washing using the following slit coating conditions. The coated layer formed on the surface of the substrate side of the $100^{th}$ sheet was observed visually, and number of pieces of generated foreign matter was counted.

(Slit Coating Conditions)
Gap opening at coating head tip: 50 μm
Coating speed: 100 mm/second
Clearance between substrate and coating head: 150 μm
Coating thickness (dry layer thickness): 2 μm
Coating temperature: 23° C.

3. Contrast

The colored photosensitive compositions were coated on glass substrates (100 mm×100 mm, trade name 1737, made by Corning Incorporated) so that the y value serving as an index of color density was 0.090, and these coated substrates where dried for 60 seconds in a 90° C. oven (prebaking). Then, the entire surface of the coated layer was exposed at 200 mJ/cm$^2$ (illumination of 20 mW/cm$^2$), and after light-exposure the coated layer was covered with a 1% aqueous solution of alkali developing solution CDK-1 (trade name, made by FUJIFILM Electronic Materials Co., Ltd.) and left to stand for 60 seconds. After standing, pure water was distributed thereon as a shower, and the developing liquid was flushed away. The coated layer that had been subjected to photo-curing treatment and developing as described above was then heat treated for 1 hour in a 220° C. oven (post bake), and substrates with colored layers formed thereon were produced. These substrates with colored layers formed thereon were placed between two polarizing plates, and the luminance when the polarizing plates were parallel to each other, and the luminance when the polarizing plates were orthogonal to each other, were measured using a BM-5 (trade name, made by Topcon Corporation), and the values (=luminance when parallel/luminance when orthogonal) obtained were taken as the index for evaluating contrast.

TABLE 1

| | Solvent Solubility | Coating Foreign Matter | Contrast |
| --- | --- | --- | --- |
| Example 1 | 20 sec | 15 pieces | 10 000 |
| Example 2 | 10 sec | 3 pieces | 13 000 |
| Comparative Example 1 | 80 sec | 150 pieces | 6000 |

It is clear from Table 1 that a colored pattern formed with the colored curable composition of the present invention is excellent in solvent solubility, and foreign matter generation during coating is effectively suppressed even when continuous coating is carried out with a slit coating device, giving excellent slit coating suitability. High contrast and good color characteristics are also shown.

According to the present invention, even when a pigment that has been made fine is included, a colored curable composition excellent in pigment dispersibility and dispersion stability may be provided with suppressed generation of foreign matter and the like during slit coating, and a highly uniform colored layer may be formed with excellent cleanability and solubility of the dry colored layer.

According to the present invention, by using the above colored curable composition of the present invention, generation of foreign matter is suppressed and a colored pattern with uniform hue is attainable. An excellent contrast color filter, provided with the colored pattern, is also provided.

Namely, the present invention provides the following items <1> to <8>. <1> A colored curable composition including a pigment (A) made into fine particles in the presence of sodium chloride (NaCl), an alkali soluble resin (B), a polymerizable compound (C), a photopolymerization initiator (D), and a solvent (E), wherein the pigment is included at 40 mass % to 70 mass % with respect to the total solids of the colored curable composition, and the contact angle of water to a coated layer obtained from coating the colored curable composition on a substrate and drying is 60° or greater.

<2> The colored curable composition <1> wherein the surface roughness of the coated layer obtained from coating the colored curable composition on a substrate and drying is in the range of from 0.1 nm to 8 nm.

<3> The colored curable composition <1> wherein the pigment used is one obtained by pulverizing the pigment in the presence of a polymer compound as well as the sodium chloride in the process of making the pigment into fine particles.

<4> The colored curable composition <1> further including a polymer dispersant (F).

<5> The colored curable composition <1> wherein the volume basis median particle size (D50) of the sodium chloride is 1 to 50 μm, and the 95 percentile particle size (D95) thereof is 80 μm or less.

<6> The colored curable composition <1> wherein the amount of magnesium contained in the sodium chloride is the range of 0.002 mass % to 0.08 mass %.

<7> A colored pattern of the present invention applicable to image forming of color proofs or the like, or to colored pixels or a light-blocking layer of a color filter, the colored pattern being formed by slit coating any one of the colored curable compositions <1> to <6>, and applying energy and curing thereof.

<8> A color filter applicable to a liquid crystal device or to a solid-state sensing device, the color filter including the colored pattern <7> on a substrate.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated.

All publications, patent applications, and technical standards mentioned in this specification are herein incorporated by reference to the same extent as if such individual publication, patent application, or technical standard was specifically and individually indicated to be incorporated by reference. It will be obvious to those having skill in the art that many changes may be made in the above-described details of the preferred embodiments of the present invention. It is intended that the scope of the invention be defined by the following claims and their equivalents.

What is claimed is:

1. A colored curable composition comprising a pigment (A) made into fine particles in the presence of sodium chloride (NaCl), an alkali soluble resin (B), a polymerizable compound (C), a photopolymerization initiator (D), a solvent (E) and a polymer dispersant (F) which is a graft polymer compound containing a copolymerization unit derived from a monomer having an organic dye structure or a heterocyclic structure or a terminal modified polymer compound with an organic dye structure, a heterocyclic structure, an acidic group, a basic nitrogen atom containing group, a urea group, or a urethane group as the terminal group, wherein the pigment is included at 40 mass % to 70 mass % with respect to the total solids of the colored curable composition, and the contact angle of water to a coated layer obtained from coating the colored curable composition on a substrate and drying is 60° or greater, and wherein the polymer dispersant (F) is a compound having the following structure:

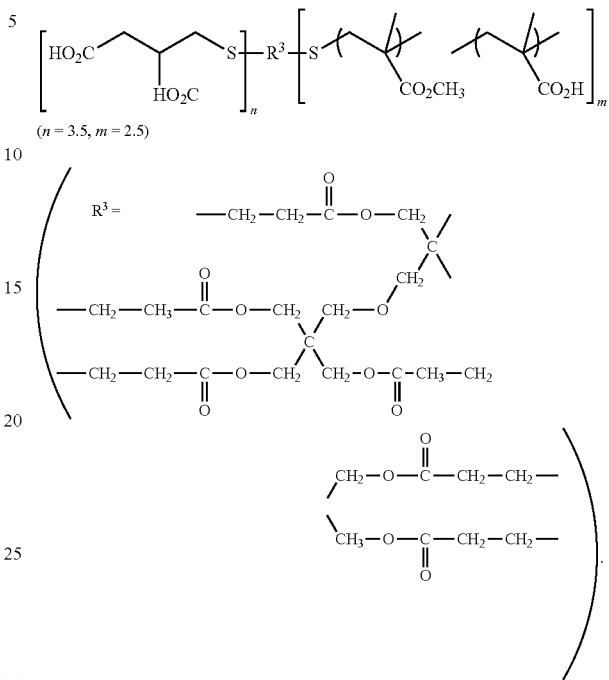

2. The colored curable composition according to claim 1 wherein the surface roughness of the coated layer obtained from coating the colored curable composition on a substrate and drying is in the range of from 0.1 nm to 8 nm.

3. The colored curable composition of claim 1 wherein the volume basis median particle size (D50) of the sodium chloride is 1 to 50 μm, and the 95 percentile particle size (D95) thereof is 80 μm or less.

4. The colored curable composition of claim 1 wherein the amount of magnesium contained in the sodium chloride is the range of 0.002 mass % to 0.08 mass %.

5. The colored curable composition of claim 1 wherein the pigment (A) has an average primary particle size of about 0.01 μm to 0.5 μm.

6. A colored pattern formed by slit coating the colored curable composition according to claim 1, and applying energy and curing.

7. A color filter comprising the colored pattern according to claim 6 on a substrate.

* * * * *